(12) United States Patent
Hayashi et al.

(10) Patent No.: US 9,629,240 B2
(45) Date of Patent: Apr. 18, 2017

(54) PREPREG AND LAMINATE INCLUDING PREPREG

(71) Applicant: ZEON CORPORATION, Tokyo (JP)

(72) Inventors: Yuuki Hayashi, Tokyo (JP); Takashi Iga, Tokyo (JP)

(73) Assignee: ZEON CORPORATION, Tokyo (JP)

( * ) Notice: Subject to any disclaimer, the term of this patent is extended or adjusted under 35 U.S.C. 154(b) by 43 days.

(21) Appl. No.: 14/369,854

(22) PCT Filed: Dec. 27, 2012

(86) PCT No.: PCT/JP2012/083812
§ 371 (c)(1),
(2) Date: Jun. 30, 2014

(87) PCT Pub. No.: WO2013/100024
PCT Pub. Date: Jul. 4, 2013

(65) Prior Publication Data
US 2014/0363646 A1 Dec. 11, 2014

(30) Foreign Application Priority Data

Dec. 28, 2011 (JP) .................................. 2011-289400
Dec. 28, 2011 (JP) .................................. 2011-289416
(Continued)

(51) Int. Cl.
*B32B 5/28* (2006.01)
*B32B 27/08* (2006.01)
(Continued)

(52) U.S. Cl.
CPC ............ *H05K 1/0373* (2013.01); *B32B 5/28* (2013.01); *B32B 27/08* (2013.01); *B32B 27/12* (2013.01);
(Continued)

(58) Field of Classification Search
CPC ..... Y10T 428/2495; B32B 5/28; B32B 27/08; B32B 27/12; B32B 2305/076; B32B 2307/206; B32B 2307/306; H05K 1/0373
(Continued)

(56) References Cited

U.S. PATENT DOCUMENTS

2009/0302462 A1 12/2009 Hosomi et al.
2011/0180208 A1* 7/2011 Tachibana ............... B32B 37/16
                                                                 156/285
2011/0205721 A1 8/2011 Endo

FOREIGN PATENT DOCUMENTS

| JP | A-2007-176169 | 7/2007 |
| JP | A-2009-242531 | 10/2009 |
| WO | WO 2010/050472 A1 | 5/2010 |

OTHER PUBLICATIONS

Apr. 2, 2013 International Search Report issued in International Application No. PCT/JP2012/083812.
(Continued)

*Primary Examiner* — Joanna Pleszczynska
(74) *Attorney, Agent, or Firm* — Oliff PLC

(57) ABSTRACT

A prepreg with a first resin layer and a second resin layer which is formed on this first resin layer, wherein the first resin layer is formed by a first resin composition, the second resin layer includes a resin layer which is formed by a second resin composition which is different from the first resin composition and in which a fiber base material is contained, the second resin layer is provided with a fiber base material-containing layer, an A layer which is positioned at an opposite side of the first resin layer side of the fiber base material-containing layer and does not contain fiber base material, and a B layer which is positioned at the first resin layer side of the fiber base material-containing
(Continued)

layer and which does not contain the fiber base material, and said B layer has a thickness smaller than the thickness of the first resin layer.

7 Claims, 1 Drawing Sheet

(30) Foreign Application Priority Data

Dec. 28, 2011 (JP) .................................. 2011-289428
Dec. 28, 2011 (JP) .................................. 2011-289439

(51) Int. Cl.
| | | |
|---|---|---|
| B32B 27/12 | (2006.01) | |
| H05K 1/03 | (2006.01) | |
| C08J 5/24 | (2006.01) | |
| B32B 37/24 | (2006.01) | |
| B32B 38/08 | (2006.01) | |
| H05K 3/00 | (2006.01) | |
| C08K 3/36 | (2006.01) | |

(52) U.S. Cl.
CPC .............. *B32B 37/24* (2013.01); *B32B 38/08* (2013.01); *C08J 5/24* (2013.01); *H05K 3/007* (2013.01); *B32B 2307/206* (2013.01); *B32B 2307/306* (2013.01); *B32B 2307/73* (2013.01); *C08K 3/36* (2013.01); *Y10T 156/10* (2015.01); *Y10T 428/2495* (2015.01)

(58) Field of Classification Search
USPC ...................................... 428/213, 297.4, 172
See application file for complete search history.

(56) References Cited

OTHER PUBLICATIONS

Apr. 2, 2013 Written Opinion of the International Searching Authority issued in International Application No. PCT/JP2012/083812.

\* cited by examiner

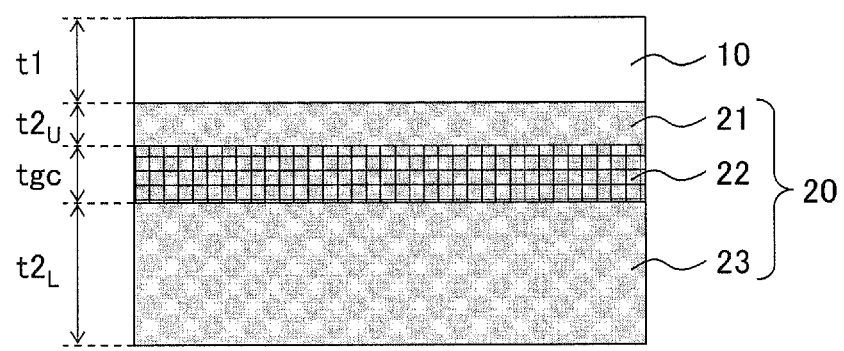

PREPREG AND LAMINATE INCLUDING PREPREG

TECHNICAL FIELD

The present invention relates to a prepreg, a laminate, and a method of production of a prepreg.

BACKGROUND ART

Along with the smaller size and increased thinness of electronic components, electronic equipment, etc. in recent years, smaller size and increased thinness of the circuit boards etc. which are used for these have been sought. For this reason, along with this, in the circuit boards, it is required to form the higher density circuit wiring patterns.

To form such high density circuit wiring patterns, multilayer structure circuit boards have been used, and the layers which form the circuit boards have been made smaller in thicknesses. When increasing the thinness of such a multilayer structure circuit board, from the viewpoint of enabling the mechanical strength of the circuit board to be maintained even when increasing the thinness, the method of using a prepreg which contains glass fiber or other fiber base material as the material which forms the interlayer insulating layer of the multilayer structure circuit board has been studied.

For example, Patent Document 1 discloses the art of using a resin varnish which contains an epoxy resin to obtain two types of thermosetting resin films with different thicknesses and sandwiching glass fibers between the obtained thermosetting resin films to obtain a prepreg. However, in the art of this Patent Document 1, the cured shaped article which is obtained by curing the prepreg is large in variation of surface roughness. For this reason, when using electroless plating etc. to form a conductor layer, there was the problem that the metal plating film was low in formability and the conductor layer could not be formed well. Further, in the art of this Patent Document 1, if reducing the thickness of the obtained prepreg to deal with the increased thinness of multilayer structure circuit boards, there was the inconvenience that when laminating the prepreg on the circuit patterns, the glass fibers which are contained in the prepreg are pushed up by the circuit patterns, the glass fibers end up being exposed at the prepreg surface due to this, and therefore the cured shaped article which is obtained by curing the prepreg ends up varying more greatly in surface roughness.

PRIOR ART DOCUMENTS

Patent Documents

Patent Document 1: Japanese Patent Publication No. 2007-176169A

SUMMARY OF THE INVENTION

Problem to be Solved by the Invention

An object of the present invention is to provide a prepreg which can give a cured shaped article which is small in variation of surface roughness, excellent in surface flatness, and can form a plated conductor layer which is substantially free of uneven plating. Further, the present invention has as its object the provision of a laminate which is obtained using such a prepreg.

Means for Solving the Problems

The inventors discovered that by providing a prepreg with a first resin layer which is comprised of a first resin composition and a second resin layer which is comprised of a second resin composition, comprising the second resin layer by a fiber base material-containing layer which contains a fiber base material, an A layer which is positioned at the opposite side to the first resin layer side and which does not contain a fiber base material, and a B layer which is positioned at the first resin layer side and which does not contain a fiber base material, and making the thickness of the B layer smaller than the thickness of the first resin layer, the above objects can be achieved and thereby completed the present invention.

That is, according to the present invention, there are provided:

[1] A prepreg provided with a first resin layer and a second resin layer which is formed on the first resin layer, wherein the first resin layer is formed by a first resin composition, the second resin layer is a layer which comprises a resin layer which is formed by a second resin composition which is different from the first resin composition and in which a fiber base material is contained, the second resin layer is provided with a fiber base material-containing layer which contains the fiber base material, an A layer which is positioned at an opposite side of the first resin layer side of the fiber base material-containing layer and which does not contain the fiber base material, and a B layer which is positioned at the first resin layer side of the fiber base material-containing layer and which does not contain the fiber base material, and the B layer has a thickness which is smaller than the thickness of the first resin layer,

[2] The prepreg as set forth in [1], wherein the B layer has a thickness of over 0 μm to 5 μm,

[3] The prepreg as set forth in [2], wherein the B layer has a thickness of over 0 μm to 2 μm,

[4] The prepreg as set forth in any one of [1] to [3], wherein a ratio of thickness of the A layer to a thickness of the prepreg as a whole is 25% or more,

[5] The prepreg as set forth in any one of [1] to [4], wherein the first resin layer has a thickness of 7 μm or less,

[6] The prepreg as set forth in [5], wherein the first resin layer has a variation in thickness of ±1 μm in range, the first resin composition and the second resin composition are in an uncured or semicured state, and the first resin composition has a viscosity which is higher than the viscosity of the second resin composition,

[7] The prepreg as set forth in any one of [1] to [6], wherein the first resin layer is a plateable layer for forming a plated conductor, and the second resin layer is an adhesive layer for adhesion with the substrate,

[8] The prepreg as set forth in any one of [1] to [7], wherein at least the second resin layer contains an inorganic filler, and a ratio of content of inorganic filler in the second resin layer is 50 to 80 wt % in range and is greater than a ratio of content of inorganic filler in the first resin layer,

[9] A laminate obtained by bonding the prepreg as set forth in any one of [1] to [8] with a surface of said second resin layer side to a substrate,

[10] A method of production of the prepreg as set forth in any one of [1] to [8] comprising a step A of using the first resin composition to form the first resin layer, a step B of superposing the fiber base material on the first resin layer, and a step C of impregnating the second resin composition in the fiber base material after the step B, where, when impregnating the second resin composition in the fiber base material in the step C, the B layer is formed between the fiber base material and the first resin layer,

[11] The method of production of a prepreg as set forth in [10] further comprising, before superposing the fiber base material on the first resin layer, forming the B layer comprised of the second resin composition on the first resin layer and superposing the fiber base material through the B layer,

[12] The method of production of the prepreg as set forth in any one of [1] to [8] comprising a step A of using the first resin composition to form the first resin layer and a step D of superposing the fiber base material in which the second resin composition is impregnated on the first resin layer to form the second resin layer, and

[13] The method of production of the prepreg as set forth in [12] further comprising, after superposing the fiber base material in which the second resin composition is impregnated on the first resin layer, further applying or casting the second resin composition on the fiber base material to form the second resin layer.

Further, according to the present invention, as other techniques to achieve the above objects, there are provided:

[1a] A prepreg provided with a first resin layer which is comprised of a first resin composition and a second resin layer which is comprised of a second resin composition which is different from the first resin composition and contains a fiber base material in the second resin layer, wherein the second resin composition is interposed between the first resin layer and the fiber base material which is contained in the second resin layer and a distance between the first resin layer and the fiber base material is over 0 μm to 2 μm,

[2a] The prepreg as set forth in [1a], wherein the first resin layer is a plateable layer for forming a plated conductor, and the second resin layer is an adhesive layer for adhesion with a substrate,

[3a] The prepreg as set forth in [1a] or [2a], wherein at least the second resin layer contains an inorganic filler, and a ratio of content of inorganic filler in the second resin layer is 50 to 80 wt % in range and is larger than the ratio of content of inorganic filler in the first resin layer,

[4a] A laminate obtained by bonding the prepreg as set forth in any one of [1a] to [3a] with a surface of said second resin layer side to a substrate,

[5a] A method of production of the prepreg as set forth in any one of [1a] to [3a] comprising a step of using the first resin composition to form the first resin layer and a step of superposing the fiber base material on the first resin layer and impregnating the second resin composition in the fiber base material while forming the second resin layer,

[6a] The method of production of the prepreg as set forth in [5a] further comprising, before superposing the fiber base material on the first resin layer, forming a layer comprised of the second resin composition on the first resin layer and superposing the fiber base material through the layer comprised of the second resin composition,

[7a] A method of production of the prepreg as set forth in any one of [1a] to [3a] comprising a step of using the first resin composition to form the first resin layer and a step of superposing the fiber base material in which the second resin composition is impregnated on the first resin layer to form the second resin layer, and

[8a] The method of production of the prepreg as set forth in [7a] further comprising, after superposing the fiber base material in which the second resin composition is impregnated on the first resin layer, further applying or casting the second resin composition on the fiber base material to form the second resin layer.

Alternatively, according to the present invention, as still other techniques to achieve the above objects, there are provided:

[1b] A prepreg provided with a first resin layer which is comprised of a first resin composition and a second resin layer which is comprised of a second resin composition which is different from the first resin composition and contains a fiber base material in the second resin layer, wherein the second resin composition is interposed between the first resin layer and the fiber base material which is contained in the second resin layer, a distance between the first resin layer and the fiber base material is over 0 μm to 5 μm, and the distance is smaller than the thickness of the first resin layer,

[2b] The prepreg as set forth in [1b], wherein the first resin layer has a thickness of 7 μm or less,

[3b] The prepreg as set forth in [1b] or [2b], wherein the first resin layer is a plateable layer for forming a plated conductor, and the second resin layer is an adhesive layer for adhesion with a substrate,

[4b] The prepreg as set forth in any one of [1b] to [3b], wherein at least the second resin layer contains an inorganic filler, and a ratio of content of inorganic filler in the second resin layer is 50 to 80 wt % in range and is larger than the ratio of content of inorganic filler in the first resin layer,

[5b] A laminate obtained by bonding the prepreg as set forth in any one of [1b] to [4b] with a surface of said second resin layer side to a substrate,

[6b] A method of production of the prepreg as set forth in any one of [1b] to [4b] comprising a step of using the first resin composition to form the first resin layer and a step of superposing the fiber base material on the first resin layer and impregnating the second resin composition in the fiber base material while forming the second resin layer,

[7b] The method of production of the prepreg as set forth in [6b] further comprising, before superposing the fiber base material on the first resin layer, forming a layer comprised of the second resin composition on the first resin layer and superposing the fiber base material through the layer comprised of the second resin composition,

[8b] The method of production of the prepreg as set forth in any one of [1b] to [4b] comprising a step of using the first resin composition to form the first resin layer and a step of superposing the fiber base material in which the second resin composition is impregnated on the first resin layer to form the second resin layer, and

[9b] The method of production of the prepreg as set forth in [8b] further comprising, after superposing the fiber base material in which the second resin composition is impregnated on the first resin layer, further applying or casting the second resin composition on the fiber base material to form the second resin layer.

Further, according to the present invention, as still other techniques to achieve the above objects, there are provided:

[1c] A prepreg which is produced through a step of forming a first resin layer which is comprised of a first resin composition and a step of superposing the fiber base material on the first resin layer and impregnating a second resin composition which is different from the first resin composition in the fiber base material while forming the second resin layer, wherein the second resin layer is provided with a fiber base material-containing layer which contains the fiber base material and an A layer which does not contain the fiber base material at an opposite side of the first resin layer and a ratio of thickness of the A layer to thickness of the prepreg as a whole is 25% or more,

[2c] a prepreg as set forth in [1c] obtained by, before superposing the fiber base material on the first resin layer, forming a layer comprised of the second resin composition on the first resin layer and superposing the fiber base material through the layer comprised of the second resin composition,

[3c] A prepreg which is produced through a step of forming a first resin layer which is comprised of a first resin composition and a step of superposing the fiber base material in which a second resin composition which is different from the first resin composition is impregnated on the first resin layer, wherein the second resin layer is provided with a fiber base material-containing layer which contains the fiber base material and an A layer which does not contain the fiber base material at an opposite side of the first resin layer and a ratio of thickness of the A layer to thickness of the prepreg as a whole is 25% or more,

[4c] The prepreg as set forth in [3c] obtained by, after the fiber base material in which the second resin composition is impregnated is superposed on the first resin layer, further applying or casting the second resin composition to form the second resin layer,

[5c] The prepreg as set forth in any one of [1c] to [4c], wherein the second resin composition is interposed between the first resin layer and the fiber base material which is contained in the second resin layer,

[6c] The prepreg as set forth in any one of [1c] to [5c], wherein the first resin layer has a thickness of 7 μm or less,

[7c] The prepreg as set forth in any one of [1c] to [6c], wherein the first resin layer is a plateable layer for forming a plated conductor, and the second resin layer is an adhesive layer for adhesion with a substrate,

[8c] The prepreg as set forth in any one of [1c] to [7c], wherein at least the second resin layer contains an inorganic filler, and a ratio of content of inorganic filler in the second resin layer is 50 to 80 wt % in range and is larger than the ratio of content of inorganic filler in the first resin layer,

[9c] A laminate obtained by bonding the prepreg as set forth in any one of [1c] to [8c] with a surface of said second resin layer side to a substrate,

[10c] A method of production of a prepreg comprising a step of forming a first resin layer which is comprised of a first resin composition and a step of superposing the fiber base material on the first resin layer and impregnating a second resin composition which is different from the first resin composition in the fiber base material while forming the second resin layer, and

[11c] A method of production of a prepreg comprising a step of forming a first resin layer which contains a first resin composition and a step of superposing the fiber base material in which a second resin composition which is different from the first resin composition is impregnated on the first resin layer to form the second resin layer.

Alternatively, according to the present invention, as still other techniques to achieve the above objects, there are provided:

[1d] A prepreg provided with a first resin layer which is comprised of a first resin composition and a second resin layer which is comprised of a second resin composition which is different from the first resin composition and contains a fiber base material in the second resin layer, wherein the first resin layer has a thickness of 7 μm or less and has a variation of thickness of ±1 μm in range, the first resin composition which forms the first resin layer and the second resin composition which forms the second resin layer are in an uncured or semicured state, and the first resin composition which forms the first resin layer has a viscosity which is higher than the viscosity of the second resin composition which forms the second resin layer,

[2d] The prepreg as set forth in [1d], wherein the layer which is comprised of the second resin composition is interposed between the first resin layer and the fiber base material which is contained in the second resin layer,

[3d] The prepreg as set forth in [1d] or [2d], wherein the first resin layer is a plateable layer for forming a plated conductor, and the second resin layer is an adhesive layer for adhesion with a substrate,

[4d] The prepreg as set forth in any one of [id] to [3d], wherein at least the second resin layer contains an inorganic filler, and a ratio of content of inorganic filler in the second resin layer is 50 to 80 wt % in range and is larger than the ratio of content of inorganic filler in the first resin layer,

[5d] A laminate obtained by bonding the prepreg as set forth in any one of [1d] to [4d] with a surface of said second resin layer side to a substrate,

[6d] A method of production of the prepreg as set forth in any one of [1d] to [4d] comprising a step of using the first resin composition to form the first resin layer and a step of superposing the fiber base material on the first resin layer and impregnating the second resin composition in the fiber base material while forming the second resin layer,

[7d] The method of production of the prepreg as set forth in [6d] further comprising, before superposing the fiber base material on the first resin layer, forming the layer comprised of the second resin composition on the first resin layer and superposing the fiber base material through the layer comprised of the second resin composition,

[8d] A method of production of the prepreg as set forth in any one of [1d] to [4d] comprising a step of using the first resin composition to form the first resin layer and a step of superposing the fiber base material in which the second resin composition is impregnated on the first resin layer on the fiber base material to form the second resin layer, and

[9d] The method of production of the prepreg as set forth in [8d] further comprising, after superposing the fiber base material in which the second resin composition is impregnated on the first resin layer, further applying or casting the second resin composition on the fiber base material to form the second resin layer.

Effects of the Invention

According to the present invention, it is possible to provide a prepreg which can give a cured shaped article which is small in variation in surface roughness, excellent in surface flatness, and can form a plated conductor layer which is substantially free of uneven plating.

BRIEF DESCRIPTION OF DRAWINGS

FIG. 1 is a schematic view which shows an example of a prepreg according to the present invention.

DESCRIPTION OF EMBODIMENTS

The prepreg of the present invention is provided with a first resin layer and a second resin layer which is formed on this first resin layer. The first resin layer is formed by a first resin composition, while the second resin layer is a resin layer which formed by a second resin composition which is different from the first resin composition and contains a fiber base material. The second resin layer is provided with a fiber base material-containing layer which contains the fiber base material, an A layer which is positioned at an opposite side of the first resin layer side of the fiber base material-containing layer and which does not contain the fiber base material, and a B layer which is positioned at the first resin layer side of the fiber base material-containing layer and which does not contain the fiber base material, where the thickness of the B layer is smaller than the thickness of the first resin layer.

(First Resin Composition)

First, the first resin composition for forming the first resin layer will be explained. The first resin which is contained in the first resin composition used in the present invention is not particularly limited, but, for example, an alicyclic olefin polymer, epoxy resin, phenol resin, polyimide resin, triazine resin, melamine resin or modified resins which are obtained by modifying these etc. may be mentioned. These may be used alone or as two types or more combined. From the viewpoint of making the prepreg of the present invention cross-linkable, a resin which has cross-linkable functional groups or cross-linkable carbon-carbon unsaturated bonds is preferable. Among these as well, from the viewpoint of achieving a good balance of heat resistance, waterproofness, and electrical characteristics when applying the obtained prepreg to a circuit board, an alicyclic olefin polymer which contains polar groups is preferable. Below, a polar group-containing alicyclic olefin polymer as the first resin to be included in the first resin composition is defined as a "polar group-containing alicyclic olefin polymer (A1)" and the case using a polar group-containing alicyclic olefin polymer (A1) as a first resin will be explained as an example. Note that, the following explanation can be similarly suitably applied even when using a resin other than a polar group-containing alicyclic olefin polymer (A1).

As the alicyclic structure which forms the polar group-containing alicyclic olefin polymer (A1) used in the present invention, a cycloalkane structure, cycloalkene structure, etc. may be mentioned, but from the viewpoint of the mechanical strength, heat resistance, etc., a cycloalkane structure is preferable. Further, as the alicyclic structure, a monocyclic, polycyclic, condensed polycyclic, or bridged ring structure, polycyclic structure comprised of a combination of these etc. may be mentioned. The number of carbon atoms which form the alicyclic structure is not particularly limited, but is usually 4 to 30, preferably 5 to 20, more preferably 5 to 15 in range. When the number of carbon atoms which form the alicyclic structure is in this range, the various characteristics of the mechanical strength, heat resistance, and formability are balanced to a high degree, so this is preferable. Note that, the polar group-containing alicyclic olefin polymer (A1) itself usually exhibits thermoplasticity, but if used in combination with a curing agent, thermosettability can be exhibited.

The alicyclic structure of the polar group-containing alicyclic olefin polymer (A1) is comprised of olefin monomer units which have an alicyclic structure formed by carbon atoms (that is, alicyclic olefin monomer units) or monomer units which can be viewed the same as alicyclic olefin monomer units (below, these being referred to together as "alicyclic olefin monomer units"). The polar group-containing alicyclic olefin polymer (A1) may contain not only alicyclic olefin monomer units, but also other monomer units. The ratio of the alicyclic olefin monomer units in the polar group-containing alicyclic olefin polymer (A1) is not particularly limited, but is usually 30 to 100 wt %, preferably 50 to 100 wt %, more preferably 70 to 100 wt %. If the ratio of the alicyclic olefin monomer units is too small, the heat resistance is inferior, so this is not preferable. The monomer units other than alicyclic olefin monomer units are not particularly limited and may be suitably selected in accordance with the objective.

The polar group of the polar group-containing alicyclic olefin polymer (A1) is not particularly limited, but an alcoholic hydroxyl group, phenolic hydroxyl group, carboxyl group, alkoxyl group, epoxy group, glycidyl group, oxycarbonyl group, carbonyl group, amino group, ester group, carboxylic acid anhydride group, sulfonic acid group, phosphoric acid group, etc. may be mentioned, but among these as well, a carboxyl group, carboxylic acid anhydride group, and phenolic hydroxyl group are preferable, while a carboxylic acid anhydride group is more preferable. Note that, the polar group-containing alicyclic olefin polymer (A1) may be one which has two or more types of polar groups. Further, the polar groups of the polar group-containing alicyclic olefin polymer (A1) may be directly bonded to the atoms forming the mainchain of the polymer or may be bonded through methylene groups, oxy groups, oxycarbonyloxyalkylene groups, phenylene groups, or other bivalent groups. The polar groups may be bonded to alicyclic olefin monomer units or may be bonded to monomer units other than alicyclic olefin monomer units. The content of the monomer units which has polar groups in the polar group-containing alicyclic olefin polymer (A1) is not particularly limited, but is usually 4 to 60 mol % in 100 mol % of the total monomer units which form the polar group-containing alicyclic olefin polymer (A1), preferably 8 to 50 mol %.

The polar group-containing alicyclic olefin polymer (A1) used in the present invention can, for example, be obtained by the following methods. That is, it can be obtained by (1) the method of polymerizing an alicyclic olefin which has polar groups with, according to need, the addition of other monomers, (2) the method of copolymerizing an alicyclic olefin which does not have polar groups together with a monomer which has polar groups, (3) the method of polymerizing an aromatic olefin which has polar groups with, according to need, the addition of other monomers and hydrogenating the aromatic ring part of the obtained polymer, (4) the method of copolymerizing an aromatic olefin which does not have polar groups with a monomer which has polar groups and hydrogenating the aromatic ring part of the obtained polymer, or (5) the method of introducing into the alicyclic olefin polymer which does not have polar groups a compound which has polar groups by a modification reaction, or (6) the method of converting the polar groups of the alicyclic olefin polymer which has polar groups (for example carboxylic acid ester groups etc.) which are obtained by the above (1) to (5) by, for example, hydrolysis etc. to other polar groups (for example, carboxyl groups), etc. Among these as well, a polymer which is obtained by the method of the above-mentioned (1) is suitable.

For the polymerization method for obtaining the polar group-containing alicyclic olefin polymer (A1) used in the present invention, ring opening polymerization or addition polymerization may be used, but in the case of ring opening polymerization, it is preferable to hydrogenate the obtained ring-opening polymer.

As specific examples of the alicyclic olefin which has polar groups, 5-hydroxycarbonylbicyclo[2.2.1]hept-2-ene, 5-methyl-5-hydroxycarbonylbicyclo[2.2.1]hept-2-ene, 5-carboxymethyl-5-hydroxycarbonylbicyclo[2.2.1]hept-2-ene, 9-hydroxycarbonyltetracyclo[6.2.1.1$^{3,6}$.0$^{2,7}$]dodec-4-ene, 9-methyl-9-hydroxycarbonyltetracyclo[6.2.1.1$^{3,6}$.0$^{2,7}$]dodec-4-ene, 9-carboxymethyl-9-hydroxycarbonyltetracyclo[6.2.1.1$^{3,6}$.0$^{2,7}$]dodec-4-ene, 5-exo-6-endo-dihydroxycarbonylbicyclo[2.2.1]hept-2-ene, 9-exo-10-endo-dihydroxycarbonyltetracyclo[6.2.1.1$^{3,6}$.0$^{2,7}$] dodec-4-ene, and other alicyclic olefins which have carboxyl groups; bicyclo[2.2.1]hept-2-ene-5,6-dicarboxylic acid anhydride, tetracyclo[6.2.1.1$^{3,6}$.0$^{2,7}$]dodec-4-ene-9,10-dicarboxylic acid anhydride, hexacyclo[10.2.1.1$^{3,10}$.1$^{5,8}$.0$^{2,11}$.0$^{4,9}$]heptadeca-6-ene-13,14-dicarboxylic acid anhydride, and other alicyclic olefins which have carboxylic acid anhydride groups; 9-methyl-9-methoxycarbonyltetracyclo [6.2.1.1$^{3,6}$.0$^{2,7}$]dodec-4-ene, 5-methoxycarbonyl-bicyclo [2.2.1]hept-2-ene, 5-methyl-5-methoxycarbonyl-bicyclo [2.2.1]hept-2-ene, and other alicyclic olefins which have carboxylic acid ester groups; (5-(4-hydroxyphenyl)bicyclo [2.2.1]hept-2-ene, 9-(4-hydroxyphenyl)tetracyclo[6.2.1.1$^{3,6}$.0$^{2,7}$]dodec-4-ene, N-(4-hydroxyphenyl) bicyclo[2.2.1] hept-5-ene-2,3-dicarboxylmide, and other alicyclic olefins which have phenolic hydroxyl groups, etc. may be mentioned. These may be used alone or may be used in two or more types.

As specific examples of the alicyclic olefin which does not have polar groups, bicyclo[2.2.1]hept-2-ene (caution name: norbornene), 5-ethyl-bicyclo[2.2.1]hept-2-ene, 5-butyl-bicyclo[2.2.1]hept-2-ene, 5-ethylidene-bicyclo[2.2.1] hept-2-ene, 5-methylidene-bicyclo [2.2.1]hept-2-ene, 5-vinyl-bicyclo[2.2.1]hept-2-ene, tricyclo[5.2.1.0$^{2,6}$]deca-3,8-diene (common name: dicyclopentadiene) tetracyclo [6.2.1.1$^{3,6}$.0$^{2,7}$]dodec-4-ene (common name: tetracyclododecene), 9-methyl-tetracyclo[6.2.1.1$^{3,6}$.0$^{2,7}$]dodec-4-ene, 9ethyl-tetracyclo[6.2.1.1$^{3,6}$.0$^{2,7}$]dodec-4-ene, 9-methylidene-tetracyclo[6.2.1.1$^{3,6}$.0$^{2,7}$]dodec-4-ene, 9-ethylidene-tetracyclo[6.2.1.1$^{3,6}$.0$^{2,7}$]dodec-4-ene, 9-methoxycarbonyl-tetracyclo[6.2.1.1$^{3,6}$.0$^{2,7}$]dodec-4-ene, 9-vinyl-tetracyclo [6.2.1.1$^{3,6}$.0$^{2,7}$]dodec-4-ene, 9-propenyl-tetracyclo [6.2.1.1$^{3,6}$.0$^{2,7}$]dodec-4-ene, 9-phenyl-tetracyclo[6.2.1.1$^{3,6}$0$^{2,7}$]dodec-4-ene, tetracyclo[9.2.1.0$^{2,10}$0$^{3,8}$]tetradeca-3,5,7, 12-tetraene, cyclopentene, cyclopentadiene, etc. may be mentioned. These may be used alone or may be used in two or more types.

As examples of the aromatic olefin which does not have polar groups, styrene, α-methylstyrene, divinylbenzene, etc. may be mentioned. When these specific examples have the polar groups, the example of an aromatic olefin which has polar groups may be mentioned. These may be used alone or may be used in two or more types.

As the monomer which can be copolymerized with alicyclic olefins or aromatic olefins and which has polar groups other than alicyclic olefins which have polar groups, ethylenically unsaturated compounds which have polar groups may be mentioned. As specific examples of these, acrylic acid, methacrylic acid, α-ethylacrylic acid, 2-hydroxyethyl (meth)acrylic acid, maleic acid, fumaric acid, itaconic acid, and other unsaturated carboxylic acid compounds; maleic anhydride, butenylsuccinic anhydride, tetrahydrophthalic anhydride, citraconic anhydride, and other unsaturated carboxylic acid anhydrides; etc. may be mentioned. These may be used alone or may be used in two or more types.

As the monomer which can be copolymerized with alicyclic olefins or aromatic olefins and which does not have polar groups other than alicyclic olefins, unsaturated compounds which do not have polar groups may be mentioned. As specific examples of these, ethylene, propylene, 1-butene, 1-pentene, 1-hexene, 3-methyl-1-butene, 3-methyl-1-pentene, 3-ethyl-1-pentene, 4-methyl-1-pentene, 4-methyl-1-hexene, 4,4-dimethyl-1-hexene, 4,4-dimethyl-1-pentene, 4-ethyl-1-hexene, 3-ethyl-1-hexene, 1-octene, 1-decene, 1-dodecene, 1-tetradecene, 1-hexadecene, 1-octadecene, 1-eicosene, and other $C_2$ to $C_{20}$ ethylene or α-olefins; 1,4-hexadiene, 4-methyl-1,4-hexadiene, 5-methyl-1,4-hexadiene, 1,7-octadiene, and other unconjugated diener; etc. may be mentioned. These may be used alone or may be used in two or more types.

The polar group-containing alicyclic olefin polymer (A1) used in the present invention is not particularly limited in molecular weight, but a weight average molecular weight converted to polystyrene, measured by gel permeation chromatography using tetrahydrofuran as a solvent, of 1,000 to 1,000,000 in range is preferable, 3,000 to 500,000 in range is more preferable, and 5,000 to 300,000 in range is particularly preferable. By making the weight average molecular weight in this range, it is possible to make the obtained prepreg excellent in mechanical strength and workability.

As the polymerization catalyst in the case of obtaining the polar group-containing alicyclic olefin polymer (A1) used in the present invention by ring opening polymerization, a conventionally known metathesis polymerization catalyst can be used. As the metathesis polymerization catalyst, a transition metal compound which contains atoms of Mo, W, Nb, Ta, Ru, etc. may be illustrated. Among these, compounds which contain Mo, W, or Ru are high in polymerization activity and therefore preferred. As specific examples of particularly preferable metathesis polymerization catalysts, (1) catalysts which include, as main catalysts, molybdenum or tungsten compounds which has halogen groups, imide groups, alkoxyl groups, allyloxy groups, or carbonyl groups as ligands and include organometallic compounds as second ingredients and (2) metal carbene complex catalysts which have Ru as the central metal may be mentioned.

As examples of compounds which are used as the main catalysts in the catalysts of the above (1), $MoCl_5$, $MoBr_5$, and other halogenated molybdenum compounds and $WCl_6$, $WOCl_4$, tungsten(phenylimide)tetrachloride diethyl ether and other halogenated tungsten compounds may be mentioned. Further, as the organometallic compounds which are used as the second ingredients in the catalyst of the above (1), organometallic compounds of Group I, Group II, Group XII, Group XIII, or Group XIV of the Periodic Table may be mentioned. Among these, organolithium compounds, organomagnesium compounds, organozinc compounds, organoaluminum compounds, and organotin compounds are preferable, while organolithium compounds, organoaluminum compounds, and organotin compounds are particularly preferable. As organolithium compounds, n-butyllithium, methyllithium, phenyllithium, neopentyllithium, neophyllithium, etc. may be mentioned. As organomagnesium compounds, butylethylmagnesium, butyloctylmagnesium, dihexylmagnesium, ethylmagnesium chloride, n-butylmagnesium chloride, allylmagnesium bromide, neopentylmagnesium chloride, neophylmagnesium chloride, etc. may be mentioned. As organozinc compounds, dimethylzinc, diethylzinc, diphenylzinc, etc. may be mentioned. As organoaluminum compounds, trimethylaluminum, triethylaluminum, triisobutylaluminum, diethylaluminum chloride, ethylaluminum sesquichloride, ethylaluminum dichloride, diethylaluminum ethoxide, ethylaluminum diethoxide, etc. may be mentioned. Furthermore, it is possible to use aluminoxane compounds which are obtained by reaction of these organoaluminum compounds and water. As organotin compounds, tetramethyltin, tetra(n-butyl)tin, tetraphenyltin, etc. may be mentioned. The amounts of these organometallic compounds differ depending on the organometallic compounds used, but by molar ratio with respect to the central metal of the main catalyst, 0.1 to 10,000 times is preferable, 0.2 to 5,000 times is more preferable, and 0.5 to 2,000 times is particularly preferable.

Further, as the metal carbene complex catalyst having Ru as a central metal in the above (2), (1,3-dimesitylimidazolidin-2-ylidene)(tricyclohexylphosphine)benzylideneruthenium dichloride, bis(tricyclohexylphosphine)benzylideneruthenium dichloride, tricyclohexylphosphine-[1,3-bis(2,4,6-trimethylphenyl)-4,5-dibromoimidazol-2-ylidene]-[benzylidene]ruthenium dichloride, 4-acetoxybenzylidene(dichloro)(4,5-dibromo-1,3-dimesityl-4-imidazolin-2-ylidene)(tricyclohexylphosphine)ruthenium, etc. may be mentioned.

The ratio of use of the metathesis polymerization catalyst is, by molar ratio with respect to the monomers which are used for the polymerization (transition metal in metathesis polymerization catalyst:monomers), usually 1:100 to 1:2,000,000 in range, preferably 1:200 to 1:1,000,000 in range. If the amount of the catalyst is too great, the removal of the catalyst becomes difficult, while if too small, a sufficient polymerization activity is liable to be unable to be obtained.

The polymerization reaction is usually performed in an organic solvent. The organic solvent which is used is not particularly limited so long as the polymer dissolves or disperses under predetermined conditions and the solvent does not affect the polymerization, but one which is generally used industrially is preferable. As specific examples of the organic solvent, pentane, hexane, heptane, and other aliphatic hydrocarbons; cyclopentane, cyclohexane, methylcyclohexane, dimethylcyclohexane, trimethylcyclohexane, ethylcyclohexane, diethylcyclohexane, decahydronaphthalene, bicycloheptane, tricyclodecane, hexahydroindene, cyclooctane, and other aliphatic hydrocarbons; benzene, toluene, xylene, and other aromatic hydrocarbons; dichloromethane, chloroform, 1,2-dichloroethane, and other halogen-containing aliphatic hydrocarbons; chlorobenzene, dichlorobenzene, and other halogen-containing aromatic hydrocarbons; nitromethane, nitrobenzene, acetonitrile, and other nitrogen-containing hydrocarbons; diethyl ether, tetrahydrofuran, and other ethers; anisole, phenetol, and other aromatic ethers; etc. may be mentioned. Among these as well, the industrially generally used aromatic hydrocarbons and aliphatic hydrocarbons, alicyclic hydrocarbons, ethers, and aromatic ethers are preferable.

The use amount of the organic solvent is preferably an amount which gives a concentration of the monomers in the polymerization solution of 1 to 50 wt %, more preferably 2 to 45 wt %, particularly preferably 3 to 40 wt %. If the concentration of the monomers is less than 1 wt %, the productivity becomes poor, while if over 50 wt %, the solution after polymerization becomes too high in viscosity and the subsequent hydrogenation reaction sometimes becomes difficult.

The polymerization reaction is started by mixing the monomers which are used for the polymerization and the metathesis polymerization catalyst. As the method for mixing these, the metathesis polymerization catalyst solution may be added to the monomer solution or vice versa. When the metathesis polymerization catalyst which is used is a mixed catalyst of a main catalyst constituted by a transition metal compound and a second ingredient constituted by an organometallic compound, the reaction solution of the mixed catalyst may be added to the monomer solution or vice versa. Further, a solution of the transition metal compound may be added to a mixed solution of the monomers and organometallic compound or vice versa. Furthermore, an organometallic compound may be added to a mixed solution of the monomers and a transition metal compound or vice versa.

The polymerization temperature is not particularly limited, but is usually −30° C. to 200° C., preferably 0° C. to 180° C. The polymerization time is not particularly limited, but is usually 1 minute to 100 hours.

As the method of adjusting the molecular weight of the obtained polar group-containing alicyclic olefin polymer (A1), the method of adding a suitable amount of a vinyl compound or diene compound may be mentioned. The vinyl compound which is used for adjustment of the molecular weight is not particularly limited so long as an organic compound which has vinyl groups, but 1-butene, 1-pentene, 1-hexene, 1-octene, and other α-olefins; styrene, vinyltoluene, and other styrenes; ethylvinyl ether, i-butylvinyl ether, allylglycidyl ether, and other ethers; allylchloride and other halogen-containing vinyl compounds; allyl acetate, allyl alcohol, glycidyl methacrylate, and other oxygen-containing vinyl compounds, acrylamide and other nitrogen-containing vinyl compounds, etc. may be mentioned. As the diene compounds which are used for adjustment of the molecular weight, 1,4-pentadiene, 1,4-hexadiene, 1,5-hexadiene, 1,6-heptadiene, 2-methyl-1,4-pentadiene, 2,5-dimethyl-1,5-hexadiene, and other unconjugated dienes or 1,3-butadiene, 2-methyl-1,3-butadiene, 2,3-dimethyl-1,3-butadiene, 1,3-pentadiene, 1,3-hexadiene, and other conjugated dienes may be mentioned. The amount of addition of the vinyl compound or diene compound may be freely selected, in accordance with the molecular weight which is targeted, from 0.1 to 10 mol %.

As the polymerization catalyst when obtaining the polar group-containing alicyclic olefin polymer (A1) used in the present invention by addition polymerization, for example, a catalyst which is comprised of a titanium, zirconium, or vanadium compound and an organoaluminum compound may be suitably used. These polymerization catalysts can be used alone or as two or more types combined. The amount of the polymerization catalyst is, by molar ratio of the metal compound in the polymerization catalyst:monomers which are used for the polymerization, usually 1:100 to 1:2,000,000 in range.

When using a hydrogenated product of a ring-opening polymer as the polar group-containing alicyclic olefin polymer (A1) used in the present invention, the hydrogenation of the ring-opening polymer is usually performed by using a hydrogenation catalyst. The hydrogenation catalyst is not particularly limited, but one which is generally used at the time of hydrogenation of an olefin compound may be suitably employed. As specific examples of a hydrogenation catalyst, for example, a Ziegler catalyst which is comprised of a combination of a transition metal compound and an alkali metal compound such as cobalt acetate and triethylaluminum, nickel acetyl acetonate and triisobutylaluminum, titanocene dichloride and n-butyllithium, zirconocene dichloride and sec-butyllithium, and tetrabutoxytitanate and dimethylmagnesium; dichlorotris(triphenylphosphine)rhodium, the ones which are described in Japanese Patent Publication No. 7-2929A, Japanese Patent Publication No.

7-149823A, Japanese Patent Publication No. 11-209460A, Japanese Patent Publication No. 11-158256A, Japanese Patent Publication No. 11-193323A, Japanese Patent Publication No. 11-209460A, etc., precious metal complex catalysts comprised of bis(tricyclohexylphosphine) benzylidyneruthenium (IV)dichloride and other ruthenium compounds; and other homogeneous catalysts may be mentioned. Further, heterogeneous catalysts of nickel, palladium, platinum, rhodium, ruthenium, and other metals carried on a carbon, silica, diatomaceous earth, alumina, titanium oxide, and other carrier, for example, nickel/silica, nickel/diatomaceous earth, nickel/alumina, palladium/carbon, palladium/silica, palladium/diatomaceous earth, palladium/alumina, etc., may also be used. Further, the above-mentioned metathesis polymerization catalysts may also be used as they are as hydrogenation catalysts.

The hydrogenation reaction is usually performed in an organic solvent. The organic solvent may be suitably selected in accordance with the solubility of the hydrogenated product which is produced. An organic solvent similar to the organic solvent which is used in the above-mentioned polymerization reaction may be used. Therefore, after the polymerization reaction, there is no need to replace the organic solvent. It is possible to add a hydrogenation catalyst for a reaction as is. Furthermore, among the organic solvents which are used for the above-mentioned polymerization reaction, from the viewpoint of their not reacting at the time of the hydrogenation reaction, an aromatic hydrocarbons, aliphatic hydrocarbons, alicyclic hydrocarbons, ethers, or aromatic ethers is preferable, while an aromatic ether is more preferable.

The hydrogenation reaction conditions may be suitably selected in accordance with the type of the hydrogenation catalyst which is used. The reaction temperature is usually −20 to 250° C., preferably −10 to 220° C., more preferably 0 to 200° C. If lower than −20° C., the reaction velocity becomes slow, while conversely if higher than 250° C., secondary reactions easily occur. The pressure of the hydrogen is usually 0.01 to 10.0 MPa, preferably 0.05 to 8.0 MPa. If the hydrogen pressure is lower than 0.01 MPa, the hydrogenation reaction velocity becomes slow, while if higher than 10.0 MPa, a high pressure resistant reaction apparatus becomes necessary.

The time of the hydrogenation reaction is suitably selected for controlling the hydrogenation rate. The reaction time is usually 0.1 to 50 hours in range. It is possible to hydrogenate 50 mol % or more of the 100 mol % of carbon-carbon double bonds of the mainchain in the polymer, preferably 70 mol % or more, more preferably 80 mol % or more, particularly preferably 90 mol % or more.

After performing the hydrogenation reaction, it is possible to perform processing to remove the catalyst which is used for the hydrogenation reaction. The method of removal of the catalyst is not particularly limited. Centrifugation, filtration, or other methods may be mentioned. Furthermore, it is possible to add water, alcohol, or another catalyst deactivator or add active clay, alumina, diatomaceous earth, or another adsorbent so as to promote removal of the catalyst. The polar group-containing alicyclic olefin polymer (A1) used in the present invention may be used as the polymer solution after polymerization or the hydrogenation reaction or may be used after removal of the solvent, but since dissolution or dispersion of the additives becomes better when preparing the resin composition and since the process can be simplified, use as a polymer solution is preferable.

The amount of the polar group-containing alicyclic olefin polymer (A1) as the first resin in the first resin composition used in the present invention is preferably made a range whereby the ratio of content of the polar group-containing alicyclic olefin polymer (A1) as the first resin with respect to the solid content when made the first resin layer is usually 20 to 90 wt %, preferably 25 to 80 wt %, more preferably 40 to 75 wt %. In the present invention, by making the ratio of content of the polar group-containing alicyclic olefin polymer (A1) as the first resin in the first resin layer in the above range, it is possible to form a first resin layer which does not become fluid when heating and laminating the obtained prepreg on a substrate and which does not easily change in thickness and possible to keep low the surface roughness of the first resin layer side of the cured shaped article which is obtained by curing the obtained prepreg while improving the peel strength with the plated conductor when forming a plated conductor layer on the surface.

Further, the first resin composition used in the present invention preferably contains, in addition to the polar group-containing alicyclic olefin polymer (A1) as the first resin, the curing agent (A2) from the viewpoint of promoting curing of the first resin layer and improving the mechanical strength and heat resistance of the cured product of the layer. The curing agent (A2) is not particularly limited. It is possible to use a curing agent which is blended into a resin composition for forming a general electrical insulating film. As the curing agent (A2), it is preferable to use a compound which has two or more functional groups which can react with the polar groups which are provided in the polar group-containing alicyclic olefin polymer (A1) as the first resin forming the first resin composition so as to form bonds.

For example, as the curing agent which is suitably used when using one which has carboxyl groups, carboxylic acid anhydride groups or phenolic hydroxyl groups as the polar group-containing alicyclic olefin polymer (A1), a polyepoxy compound, polyisocyanate compound, polyamine compound, polyhydrazide compound, aziridine compound, basic metal oxide, organic metal halogenate, etc. may be mentioned. These may be used alone or may be used in two or more types.

As the polyepoxy compounds, for example, phenol novolac type epoxy compounds, cresol novolac type epoxy compounds, cresol type epoxy compounds, bisphenol A type epoxy compounds, bisphenol F type epoxy compounds, hydrogenated bisphenol A type epoxy compounds, and other glycidyl ether type epoxy compounds; alicyclic epoxy compounds, glycidyl ester type epoxy compounds, glycidyl amine type epoxy compounds, fluorene-type epoxy compounds, polyfunctional epoxy compounds, isocyanulate type epoxy compounds, phosphorus-containing epoxy compounds, and other polyepoxy compounds; and other compounds which have two or more epoxy groups in their molecules may be mentioned. These may be used alone or may be used in two or more types. Among these, from the viewpoint of enabling the prepreg of the present invention to be made excellent in mechanical properties, bisphenol A type epoxy compounds, polyphenol type epoxy compounds, or epoxy resins which have alicyclic olefin structures or fluorene structures are preferable. Furthermore, from the viewpoint of making the cured shaped article which is obtained by curing the resin composition in heat resistance or waterproofness, epoxy resins which have an alicyclic olefin structure are particularly preferable. Note that, these may be used alone or may be used in two or more types.

As the bisphenol A type epoxy compounds, for example, product names "jER827, jER828, jER828EL, jER828XA, and jER834" (above all made by Mitsubishi Chemical Corporation), product names "EPICLON 840, EPICLON 840-S, EPICLON 850, EPICLON 850-S, and EPICLON 850-LC" (above all made by DIC Corporation, "EPICLON" is a registered trademark), etc. may be mentioned. As the polyphenol type epoxy compound, for example, product names "1032H60 and XY-4000" (above all made by Mitsubishi Chemical Corporation), etc. may be mentioned. As epoxy resins which have alicyclic olefin structures or fluorene structures, epoxy resins which have dicyclopentadiene frameworks (for example, product names "EPICLON HP7200L, EPICLON HP7200, EPICLON HP7200H, EPICLON HP7200HH, and EPICLON HP7200HHH" (above all made by DIC Corporation); product name "Tactix 558" (made by Huntsman Advanced Materials); product names "XD-1000-1L and XD-1000-2L" (above all made by Nippon Kayaku Co., Ltd.)), epoxy resins which have fluorene frameworks (for example, product names "Oncoat EX-1010, Oncoat EX-1011, Oncoat EX-1012, Oncoat EX-1020, Oncoat EX-1030, Oncoat EX-1040, Oncoat EX-1050, and Oncoat EX-1051" (above all made by NAGASE & CO., LTD. "Oncoat" is a registered trademark); product names "OGSOL PG-100, OGSOL EG-200, and OGSOL EG-250)" (above all made by Osaka Gas Chemicals, Co., Ltd. "OGSOL" is a registered trademark)), etc. may be mentioned.

As the polyisocyanate compounds, $C_6$ to $C_{24}$ diisocyanates and triisocyanates are preferable. As examples of diisocyanates, 2,4-tolylene diisocyanate, 2,6-tolylene diisocyanate, 4,4'-diphenylmethane diisocyanate, hexamethylene diisocyanate, p-phenylene diisocyanate, etc. may be mentioned. As examples of the triisocyanates, 1,3,6-hexamethylene triisocyanate, 1,6,11-undecane triisocyanate, bicycloheptane triisocyanate, etc. may be mentioned. These may be used alone or may be used in two or more types.

As the polyamine compounds, $C_4$ to $C_{30}$ aliphatic polyamine compounds which have two or more amino groups, aromatic polyamine compounds, etc. may be mentioned. Ones, like guanidine compounds, which have unconjugated nitrogen-carbon double bonds are not included. As the aliphatic polyamine compounds, hexamethylene diamine, N,N'-dicinnamylidene-1,6-hexane diamine, etc. may be mentioned. As the aromatic polyamine compounds, 4,4'-methylenedianiline, m-phenylenediamine, 4,4'-diaminodiphenylether, 4'-(m-phenylenediisopropylidene)dianiline, 4,4'-(p-phenylenediisopropylidene)dianiline, 2,2'-bis[4-(4-aminophenoxy)phenyl]propane, 1,3,5-benzenetriamine, etc. may be mentioned. These may be used alone or may be used in two or more types.

As examples of polyhydrazide compounds, isophthalic acid dihydrazide, terephthalic acid dihydrazide, 2,6-naphthalenedicarboxylic acid dihydrazide, maleic acid dihydrazide, itaconic acid dihydrazide, trimellitic acid dihydrazide, 1,3,5-benzenetricarboxylic acid dihydrazide, pyromellitic acid dihydrazide, etc. may be mentioned. These may be used alone or may be used in two or more types.

As aziridine compounds, tris-2,4,6-(1-aziridinyl)-1,3,5-triazine, tris[1-(2-methyl)aziridinyl]phosphinoxide, hexa[1-(2-methyl)aziridinyl]triphosphatriazine, etc. may be mentioned. These may be used alone or may be used in two or more types.

Among the above-mentioned curing agents, from the viewpoint of the reactivity with the polar groups of the polar group-containing alicyclic olefin polymer (A1) being mild and the ease of handling of the resin composition, polyepoxy compounds are preferable, while glycidyl ether type epoxy compounds and alicyclic polyepoxy compounds are particularly preferably used.

In the first resin composition used in the present invention, the amount of the curing agent (A2) is preferably made a range whereby a ratio of content of the curing agent (A2) to the solid content as a whole when making the first resin layer becomes 5 to 50 wt %, more preferably 10 to 40 wt %, furthermore preferably 15 to 30 wt %. By making the ratio of content of the curing agent (A2) in the first resin layer in this range, the cured shaped article of the prepreg can be made excellent in mechanical strength and electrical characteristics, so this is preferred.

Further, the first resin composition used in the present invention preferably further contains, in addition to the polar group-containing alicyclic olefin polymer (A1) as the first resin and the curing agent (A2), an inorganic filler (A3). By further including an inorganic filler (A3), it is possible to form a first resin layer which does not become fluid when heating and laminating the obtained prepreg on a substrate and which does not easily change in thickness and possible to keep low the surface roughness of the first resin layer side of the cured shaped article which is obtained by curing the obtained prepreg while making the peel strength larger.

The inorganic filler (A3) used in the present invention is not particularly limited, but, for example, calcium carbonate, magnesium carbonate, barium carbonate, zinc oxide, titanium oxide, magnesium oxide, magnesium silicate, calcium silicate, zirconium silicate, hydrated alumina, magnesium hydroxide, aluminum hydroxide, barium sulfate, silica, talc, clay, etc. may be mentioned. Among these as well, ones which do not degrade or dissolve due to acidic compounds such as the aqueous solution of permanganate which is used for the surface roughening treatment of the cured shaped article which is obtained by curing the prepreg of the present invention are preferable. In particular, silica is preferable. This is because if the aqueous solution of permanganate or other acidic compound causes the inorganic filler to degrade or dissolve, the etching will result in deep holes being formed.

Further, in the present invention, the inorganic filler (A3) which is contained in the first resin composition may be one which is treated on its surface in advance by a coupling agent etc. or one which is not treated on its surface. Note that, the surface treatment can be performed in the same way as the later explained inorganic filler (B3).

Furthermore, the inorganic filler (A3) is preferably a nonconductive one which does not cause the obtained prepreg to drop in dielectric characteristics. Further, the inorganic filler (A3) is not particularly limited in shape. It may be spherical, fibrous, plate-shaped, etc., but to improve the dispersability and stably keep the cured product obtained by using the resin composition small in surface roughness, a fine spherical shape is preferable.

The inorganic filler (A3) has an average particle diameter of preferably 0.01 to 0.5 µm, more preferably 0.1 to 0.5 µm, particularly preferably 0.15 to 0.4 µm. By making the average particle diameter of the inorganic filler (A3) in this range, the surface roughness of the prepreg can be made in a more suitable range. Note that, the average particle diameter can be measured by a particle diameter distribution measuring device.

The amount of the inorganic filler (A3) in the first resin composition used in the present invention is preferably made in a range whereby a ratio of content of the inorganic filler (A3) with respect to the solid content as a whole when making the first resin layer becomes preferably 1 to 50 wt %, more preferably 2 to 40 wt %, furthermore preferably 3 to 30 wt %. By making the ratio of content of the inorganic filler (A3) in the first resin layer in the above range, the cured shaped article which is obtained by curing the prepreg of the present invention is kept small in surface roughness of the surface of the first resin layer side while the effect of decrease of the linear expansion coefficient is enhanced more.

Further, the first resin composition used in the present invention may, in accordance with need, contain a curing accelerator. The curing accelerator is not particularly limited, but, for example, an aliphatic polyamine, aromatic polyamine, secondary amine, tertiary amine, imidazole derivative, organic acid hydrazide, dicyan diamide and its derivatives, urea derivatives, etc. may be mentioned. Among these, an imidazole derivative is particularly preferable.

The imidazole derivative is not particularly limited so long as it is a compound which has an imidazole structure, but, for example, 2-ethylimidazole, 2-ethyl-4-methylimidazole, bis-2-ethyl-4-methylimidazole, 1-methyl-2-ethylimidazole, 2-isopropylimidazole, 2,4-dimethylimidazole, 2-heptadecylimidazole, and other alkyl substituted imidazole compounds; 2-phenylimidazole, 2-phenyl-4-methylimidazole, 1-benzyl-2-methylimidazole, 1-benzyl-2-ethylimidazole, 1-benzyl-2-phenylimidazole, benzimidazole, 2-ethyl-4-methyl-1-(2'-cyanoethyl)imidazole, and other imidazole compounds which are substituted by hydrocarbon groups which contain ring structures such as aryl groups or aralkyl groups etc. may be mentioned. These may be used alone or may be used in two or more types.

The amount when mixing in a curing accelerator may be suitably selected in accordance with the purpose of use, but is preferably 0.1 to 20 parts by weight with respect to 100 parts by weight of the polar group-containing alicyclic olefin polymer (A1) as the first resin, more preferably 0.1 to 10 parts by weight, furthermore preferably 0.1 to 5 parts by weight.

Furthermore, the first resin composition used in the present invention may include, for the purpose of improving the flame retardance of the prepreg, for example, a halogen-containing flame retardant or a phosphoric acid ester flame retardant or another flame retardant which is mixed into a resin composition for formation of a general electrical insulating film. The amount when mixing in a flame retardant is preferably 100 parts by weight or less with respect to 100 parts by weight of the polar group-containing alicyclic olefin polymer (A1) as the first resin, more preferably 60 parts by weight or less.

Further, the first resin composition used in the present invention may contain, furthermore, in accordance with need, a flame retardant aid, heat resistance stabilizer, weather resistance stabilizer, antiaging agent, UV absorber (laser processing enhancing agent), leveling agent, antistatic agent, slip agent, antiblocking agent, anticlouding agent, lubricant, dye, natural oil, synthetic oil, wax, emulsifying agent, magnetic material, dielectric characteristic adjuster, toughening agent, or other ingredient. The ratios of these optional ingredients added may be suitably selected in a range not detracting from the object of the present invention.

The method of production of the first resin composition used in the present invention is not particularly limited. The above ingredients may be mixed as they are or may be mixed in the state dissolved or dispersed in an organic solvent. Part of the ingredients may be dissolved or dispersed in an organic solvent to prepare a composition and the remaining ingredients may be mixed into that composition.

(Second Resin Composition)

Next, for second resin composition forming the second resin layer will be explained. The second resin composition used in the present invention has a composition which is different from the above-mentioned first resin composition. That is, at least one of the types and contents of the resin and other ingredients which form the resin composition, the molecular weight of the resin, etc. differ. Note that, in the prepreg of the present invention, between the above-mentioned first resin layer and the fiber base material which is contained in the second resin layer, as explained later, the B layer which is comprised of the second resin composition and which does not contain the fiber base material is interposed, and the B layer can exhibit a buffering ability of not transmitting the relief shapes of the fiber base material surface directly to the first resin layer. That is, the B layer functions as a buffer layer. In particular, in the present invention, the first resin composition which forms the first resin layer and the second resin composition which forms the second resin layer have different compositions whereby it is believed that an interface is easily formed between the B layer and first resin layer and the buffer function is exhibited well.

The second resin which is contained in the second resin composition used in the present invention is not particularly limited, but in the same way as the first resin which is contained in the above-mentioned first resin composition, a resin which has cross-linkable functional groups or cross-linkable carbon-carbon unsaturated bonds is preferable. As specific examples of the second resin, ones similar to the above-mentioned first resin may be mentioned. As the second resin, from a viewpoint similar to the first resin, an alicyclic olefin polymer which has polar groups is preferable. Below, a polar group-containing alicyclic olefin polymer as the second resin to be included in the second resin composition is defined as a "polar group-containing alicyclic olefin polymer (B1)" and the case using a polar group-containing alicyclic olefin polymer (B1) as the second resin will be explained as an example. Note that, in the following explanation, it is possible to similarly suitably apply this in the case of using a resin other than a polar group-containing alicyclic olefin polymer (B1).

As the polar group-containing alicyclic olefin polymer (B1) as the second resin, for example, it is possible to use one similar to the polar group-containing alicyclic olefin polymer (A1) used for the above mentioned first resin composition, but from the viewpoint of making the cured article of the second resin layer excellent in elasticity or heat resistance, it is preferable to use one which has a resin composition or molecular weight different from the polar group-containing alicyclic olefin polymer (A1) used for the first resin composition.

The amount of the polar group-containing alicyclic olefin polymer (B1) as the second resin in the second resin composition used in the present invention is preferably made in a range whereby the ratio of content of the polar group-containing alicyclic olefin polymer (B1) with respect to the solid content as a whole when made a second resin layer becomes 1 to 30 wt %, more preferably 1.5 to 20 wt %, furthermore preferably 2 to 10 wt %. In the present invention, by making the ratio of content of the polar group-containing alicyclic olefin polymer (B1) in the second resin layer in the above range, it is possible to improve the formability of the prepreg of the present invention and prevent breakage or dustfall at the time of work while making the second resin layer good in fluidity when heating and laminating the obtained prepreg on a substrate and making the laminate flatness and substrate bondability excellent.

Further, the second resin composition used in the present invention may contain, in addition to the polar group-containing alicyclic olefin polymer (B1) as the second resin, a curing agent (B2). The curing agent (B2) is not particularly limited. For example, it is possible to use one similar to the curing agent (A2) used in the above-mentioned first resin composition.

In the second resin composition used in the present invention, the amount of the curing agent (B2) is preferably in a range whereby the ratio of content of the curing agent (B2) with respect to the solid content as a whole when made a second resin layer becomes preferably 3 to 35 wt %, more preferably 5 to 30 wt %, furthermore preferably 10 to 25 wt %. By making the ratio of content of the curing agent (B2) in the second resin layer in the above range, the cured shaped article which is obtained by curing the prepreg of the present invention can be made excellent in mechanical strength and electrical characteristics, so this is preferred.

Furthermore, the second resin composition used in the present invention preferably contains, in addition to the polar group-containing alicyclic olefin polymer (B1) as the second resin and the curing agent (B2), an inorganic filler (B3). By further including the inorganic filler (B3), it is possible to make the cured shaped article which is obtained by curing the prepreg of the present invention low in linear expansion coefficient.

The inorganic filler (B3) used in the present invention is not particularly limited, but, for example, calcium carbonate, magnesium carbonate, barium carbonate, zinc oxide, titanium oxide, magnesium oxide, magnesium silicate, calcium silicate, zirconium silicate, hydrated alumina, magnesium hydroxide, aluminum hydroxide, barium sulfate, silica, talc, clay, etc. may be mentioned. Among these as well, from the viewpoint of improving the cured shaped article which is obtained by curing the prepreg of the present invention in electrical characteristics and heat resistance, silica is preferable.

Further, in the present invention, as the inorganic filler (B3) which is included in the second resin composition, an inorganic filler which is treated at its surface by a surface treatment agent is preferable. By using such a surface treated filler, even if adding a large amount of inorganic filler, it can be made to disperse well, it is possible to increase the elasticity of the cured article of the second resin layer, and, further, it is possible to reduce the linear expansion coefficient.

The surface treatment agent which is used for surface treatment of the inorganic filler (B3) used in the present invention is not particularly limited, but a silane coupling agent, stearic acid and other organic acid, etc. may be mentioned, but from the viewpoint of the excellent dispersability of the inorganic filler and the good fluidity of the resin composition, a silane coupling agent is preferable.

The silane coupling agent is not particularly limited, but a silane coupling agent which has functional groups which can react with the polar groups provided in the polar group-containing alicyclic olefin polymer (B1) is preferable. As such functional groups, for example, an amino group, carboxyl group, methacryloyl group, isocyanate group, epoxy group, etc. may be mentioned. Among these, an amino group, carboxyl group, and epoxy group are preferable, while an amino group is more preferable.

When using a silane coupling agent as a surface treatment agent, the amount of surface treatment of the inorganic filler (B3) is preferably 0.1 to 2 wt % based on the amount of the inorganic filler before the surface treatment (100 wt %), more preferably 0.5 to 1.5 wt %.

Further, as the inorganic filler (B3), a nonconductive one which does not cause the obtained electrical insulating layer to drop in dielectric characteristics is preferable. Further, the inorganic filler (B3) is not particularly limited in shape. A spherical shape, fiber shape, plate shape, etc. are also possible, but to make the dispersability and the resin fluidity of the resin composition better, a fine spherical shape is preferable.

The inorganic filler (B3) has an average particle diameter of preferably 0.2 to 3 μm, more preferably 0.25 to 1 μm. By using the inorganic filler (B3) having an average particle diameter in the above range, it is possible to raise the impregnability of the second resin composition in the fiber base material and improve the fluidity of the second resin layer when heating and laminating the obtained prepreg on the substrate.

The amount of the inorganic filler (B3) in the second resin composition used in the present invention is preferably made in a range whereby a ratio of content when making the second resin layer becomes greater than the ratio of content of the inorganic filler (A3) which is contained in the first resin layer (including case of ratio of content of 0 wt %). Specifically, the ratio of content of the inorganic filler (B3) with respect to the solid content as a whole (except fiber base material) when making the second resin layer is preferably 50 to 85 wt %, more preferably 55 to 80 wt %, furthermore preferably 60 to 70 wt % in range. In the present invention, by making the ratio of content of the inorganic filler (B3) in the second resin layer in the above range, it is possible to keep low the linear expansion coefficient of the cured shaped article which is obtained by curing the prepreg of the present invention. Due to this, it is possible to make the cured shaped article excellent in heat resistance.

Further, the second resin composition used in the present invention, in the same way as the above-mentioned first resin composition, may contain, for example, a curing accelerator or a flame retardant and, furthermore, in accordance with need, may contain a flame retardant aid, heat resistance stabilizer, weather resistance stabilizer, antiaging agent, UV absorber (laser processing enhancing agent), leveling agent, antistatic agent, slip agent, antiblocking agent, anticlouding agent, lubricant, dye, natural oil, synthetic oil, wax, emulsifying agent, magnetic material, dielectric characteristic adjuster, toughening agent, or another other ingredient. The ratios of these optional ingredients added may be suitably selected in a range not detracting from the object of the present invention.

The method of production of the second resin composition used in the present invention is not particularly limited. The above ingredients may be mixed as they are or may be mixed in the state dissolved or dispersed in an organic solvent. Part of the ingredients may be dissolved or dispersed in an organic solvent to prepare a composition and the remaining ingredients may be mixed into that composition.

(Prepreg)

Next, the prepreg of the present invention will be explained. The prepreg of the present invention is comprised of a first resin layer which is comprised of the above-mentioned first resin composition and a second resin layer which is comprised of the above-mentioned second resin composition. The second resin layer contains the fiber base material. Further, in the prepreg of the present invention, the second resin layer is provided with a fiber base material-containing layer which contains a fiber base material, an A layer which is positioned at the opposite side of the first resin layer side of the fiber base material-containing layer and which does not contain the fiber base material, and a B layer which is positioned at the first resin layer side of the fiber base material-containing layer and which does not contain the fiber base material. Further, in the prepreg of the present invention, the thickness of the B layer which forms the second resin layer is smaller than the thickness of the first resin layer.

Here, FIG. 1 is a schematic view which shows one example of a prepreg according to the present invention. As shown in FIG. 1, the prepreg of the present invention is provided with a first resin layer 10 and a second resin layer 20. The second resin layer 20 can be configured provided with, from the first resin layer 10 side, a B layer (upper second resin layer) 21, fiber base material-containing layer 22, and A layer (lower second resin layer) 23. The first resin layer 10 is, for example, used as the plateable layer on the surface of which a plated conductor is formed by the plating method. Further, the second resin layer 20 is, for example, used as an adhesive layer for adhesion with the substrate at its surface. In this case, when heating and laminating the obtained prepreg to the substrate, the first resin layer preferably does not become fluid and does not change in thickness, further can be maintained in a state excellent in surface flatness. On the other hand, the second resin layer preferably exhibits fluidity and can exhibit excellent bondability with respect to the substrate on which the prepreg is to be laminated in the A layer 23.

The first resin layer 10 is a layer which is comprised of the first resin composition. Further, the B layer 21 is a layer which is comprised of the second resin composition, contacts the first resin layer 10, and does not contain the fiber base material. The thickness $t2_U$ is thinner than the thickness t1 of the first resin layer 10. The fiber base material-containing layer 22 is a layer which is comprised of the fiber base material and second resin composition and is formed by impregnating the fiber base material with the second resin composition. Furthermore, the A layer 23 is a layer which is comprised of the second resin composition and is a layer which is joined with the fiber base material-containing layer 22 and is formed at the opposite side to the B layer 21. In the prepreg of the present invention, the thickness $t2_U$ of the B layer 21 corresponds to the distance between the first resin layer 10 and the fiber base material-containing layer 22.

Below, while suitably referring to FIG. 1, the prepreg of the present invention and method of production of the same will be explained in detail. The prepreg of the present invention is produced by the method of production of the following (1) or (2).

(1) Method comprising step A of using the first resin composition to form the first resin layer 10, step B of superposing the fiber base material on the formed first resin layer 10, and, after this step B, step C of impregnating the second resin composition in the fiber base material to form the second resin layer 20. Note that, in the method of production of this (1), in step C, when impregnating the second resin composition in the fiber base material, the B layer 21 is formed between the fiber base material and the first resin layer 10.

Further, in the method of production of this (1), as a method of (1a), instead of step B, it is possible to adopt step B' of forming the B layer 21 which is comprised of the second resin composition on the formed first resin layer 10 before superposing the fiber base material on the first resin layer 10 and step B" of superposing the fiber base material through the B layer 21 which is comprised of the second resin composition, and following these steps, step C of impregnating the second resin composition in the fiber base material to form the fiber base material-containing layer 22 and the A layer 23.

(2) Method comprising step A of using the first resin composition to form the first resin layer 10 and step D of superposing the fiber base material in which the second resin composition is impregnated on the formed first resin layer 10 to form the second resin layer 20.

Note that, in the methods of production of (2), as a method of (2a), after the step D of superposing the fiber base material in which the second resin composition is impregnated on the first resin layer 10 to form part of the second resin layer 20, it is possible to adopt the method of applying or casting the second resin composition on the fiber base material to form the second resin layer 20.

In the method of (1), it is possible to apply, spray, or cast the above-mentioned first resin composition on the support and dry this to form the first resin layer 10, then superpose the fiber base material on the first resin layer 10 and impregnate the above-mentioned second resin composition in the fiber base material while applying or casting it on the fiber base material and drying it to thereby form on the first resin layer 10, in order from the first resin layer 10 side, the B layer 21, fiber base material-containing layer 22, and A layer 23. In this method, the fiber base material is superposed on the first resin layer 10 and, in that state, the second resin composition is impregnated in the fiber base material while applying or casting it on the fiber base material so that part of the second resin composition which is impregnated in the fiber base material reaches the interface with the first resin layer 10 and seeps out from the fiber base material and thereby, between the first resin layer 10 and the fiber base material, the B layer 21 is formed to an extremely thin thickness, specifically, a thickness smaller than the first resin layer (thickness $t2_U$ of B layer 21<thickness t1 of first resin layer). Further, due to this, the B layer 21 is interposed between the first resin layer 10 and the fiber base material and is present as a buffer layer for preventing these first resin layer 10 and fiber base material from directly contacting.

In the method of (1a), the above-mentioned first resin composition is applied, spray, or cast on the support and dried to thereby form a first resin layer 10, then the above-mentioned second resin composition is applied or cast on the first resin layer 10 to form a layer comprised of the second resin composition on the first resin layer 10, then, without drying, the fiber base material is superposed on this, the above-mentioned second resin composition is further added to this to impregnate the fiber base material while applying or casting on the fiber base material and then drying it and thereby form on the first resin layer 10, in order from the first resin layer 10 side, the B layer 21, fiber base material-containing layer 22, and the A layer 23. In this method, by applying or casting the second resin composition on the first resin layer 10, when forming the layer comprised of the second resin composition, adopting the condition that the thickness $t2_U$ of the B layer 21 becomes thinner than the thickness t1 of the first resin layer is desirable. In particular, in this case, when superposing the fiber base material on the layer comprised of the second resin composition, due to surface tension etc., part of the second resin composition which forms the layer comprised of the second resin composition is taken into the fiber base material in some cases, so adopting the condition considering such a phenomenon is desirable.

The methods of (2) and (2a) are methods of, rather than applying etc. the second resin composition on the fiber base material to impregnate the fiber base material with the second resin composition to form the second resin layer, impregnating the fiber base material with the second resin composition in advance and using this to form the second resin layer. The second resin composition can be impregnated in the fiber base material by, for example, placing the fiber base material on any support and applying etc. this with the second resin composition. At this time, furthermore, by superposing a protective film and pressing (ironing) from above by a roller etc., impregnation of the second resin composition in the fiber base material may be promoted. With these methods, the step of impregnating the fiber base material with the second resin composition in advance is included. In this respect, the work becomes complicated, so as the method of production of the prepreg of the present invention, the method of (1) or (1a) is preferable.

Note that, in the above method, when applying, spraying, or casting the first resin composition on the support or when applying, spraying, or casting the second resin composition on the first resin layer 10 or on the fiber base material, the first resin composition or the second resin composition is preferably, if necessary, applied, sprayed, or cast with the addition of an organic solvent. When using a resin composition to which an organic solvent is added, the first resin composition is applied, spray, or cast on the support, then the organic solvent is dried off to thereby form the first resin layer, but it is also possible to apply or cast the second resin composition it in multiple stages, and when impregnating it, it may be dried in the middle of the process or it may be dried after finishing applying or casting to become the desired thickness.

Further, as the support used in this method, a resin film or metal foil etc. may be mentioned. As the resin film, a polyethylene terephthalate film, polypropylene film, polyethylene film, polycarbonate film, polyethylene naphthalate film, polyarylate film, nylon film, etc. may be mentioned. Among these films, from the viewpoint of the heat resistance, chemical resistance, peel property, etc., a polyethylene terephthalate film or polyethylene naphthalate film is preferable. As the metal foil, copper foil, aluminum foil, nickel foil, chrome foil, gold foil, silver foil, etc. may be mentioned. Note that, the surface roughness Ra of the support is usually 300 nm or less, preferably 150 nm or less, more preferably 100 nm or less.

Furthermore, as the material of the fiber base material, PET (polyethylene terephthalate) fiber, aramide fiber, ultra high molecular weight polyethylene fiber, polyamide (nylon) fiber, and liquid crystal polyester fiber, and other organic fibers; glass fiber, carbon fiber, alumina fiber, tungsten fiber, molybdenum fiber, titanium fiber, steel fiber, boron fiber, silicon carbide fiber, silica fiber, and other inorganic fibers; etc. may be mentioned. Among these, organic fiber and glass fiber are preferable, in particular, aramide fiber, liquid crystal polyester fiber, and glass fiber are preferable. As glass fiber, fibers of E glass, NE glass, S glass, D glass, H glass, T glass, etc. may be suitably used. Further, as the form of the fiber base material, the form of plain weave or twill weave or other woven fabrics or the form of nonwoven fabric etc. may be mentioned. The thickness of the fiber base material may be determined in accordance with the thickness tgc of the fiber base material-containing layer 22, but from the viewpoint of making the prepreg a thin film, 30 μm or less is preferable, and 10 to 30 μm is more preferable. If too thin, the handling becomes difficult, while if too thick, the resin layer becomes relatively thin and the wiring embedding ability sometimes becomes insufficient.

In the present invention, the thickness $t2_U$ of the B layer 21 is less than the thickness t1 of the first resin layer 10, preferably over 0 μm to 5 μm, more preferably over 0 μm to 2 μm, furthermore preferably 0.1 μm to 1.5 μm, particularly preferably 0.2 μm to 1.5 μm. In the present invention, the B layer 21 is formed between the first resin layer 10 and the fiber base material-containing layer 22 and the thickness $t2_U$ of the B layer 21 is made in the above range, but from the viewpoint of forming the interface between the first resin layer and the second resin layer well, an over 0 μm thickness is necessary. On the other hand, from the viewpoint of not being affected by the presence of the B layer and the function of the first resin layer, which is different from the second resin layer, being sufficiently exhibited, it has to be made thinner than the thicknesses t1 of the first resin layer 10. By adopting such a configuration, the B layer 21 functions as a buffer layer and the cured shaped article which is obtained by curing the prepreg of the present invention can be suppressed in variation of surface roughness and made excellent in surface flatness. Further, due to this, it is possible to effectively prevent the occurrence of uneven plating when forming a plated conductor on the surface of the first resin layer 10 side by the plating method. As a result, the cured shaped article becomes excellent in peel strength (bondability between cured shaped article and plated conductor), fine wiring formability, and electrical characteristics. Further, when laminated on a substrate with relief shapes, even if the second resin composition becomes fluid, the fiber base material will not move or twist and therefore a multilayer board free of variation in characteristics in the plane can be obtained.

Note that, other than the B layer 21, the first resin layer 10, the fiber base material-containing layer 22, and the A layer 23 are not particularly limited in thicknesses, but the following ranges are preferable.

That is, the thicknesses t1 of the first resin layer 10 may be greater than the thicknesses $t2_U$ of the B layer 21, but the specific thickness of the thickness t1 of the first resin layer 10 is preferably 7 μm or less, more preferably 2 to 7 μm, furthermore preferably 2.5 to 6 μm. By making the thickness t1 of the first resin layer 10 in this range, the obtained cured shaped article can be made good in peel strength.

Further, as the first resin layer 10, from the viewpoint of effectively preventing occurrence of uneven plating, a variation of thickness of ±1.5 μm in range is preferable, ±1 μm in range is more preferable, and ±0.5 μm in range is furthermore preferable.

Further, the thickness tgc of the fiber base material-containing layer 22 is preferably 30 μm or less, more preferably 10 to 30 μm. By making the thickness tgc of the fiber base material-containing layer 22 in this range, the obtained cured shaped article can be made good in wiring embedding ability or elasticity. Furthermore, the thickness $t2_L$ of the A layer 23 is suitably preferably 25% or more with respect to the total thickness of the prepreg of the present invention (that is, $t1+t2_U+tgc+t2_L$), more preferably 25 to 70%, furthermore preferably 40 to 65%. As the specific thickness, 9 to 35 μm is preferable, while 15 to 30 μm is more preferable. In the present invention, the thickness $t2_U$ of the B layer 21 is made in the above range and the thickness $t2_L$ of the A layer 23 is made in the above ratio with respect to the total thickness of the prepreg to thereby make the position of the fiber base material in the second resin layer 20 a position close to the first resin layer 10 side. Due to this, even when making the prepreg of the present invention a thin film, when laminating the prepreg of the present invention on the circuit patterns from the A layer 23 side, it is possible to effectively prevent that the fiber base material is exposed at the surface of the first resin layer 10 side by pressed against the circuit patterns. Further, due to this, the effect of suppression of variation of the surface roughness of the cured shaped article which is obtained by curing the prepreg of the present invention can be enhanced more. Furthermore, when laminated on a substrate, the fiber base material will not be twisted, so the flatness after lamination can be improved and, furthermore, it is possible to effectively prevent warping of the substrate.

Further, the total thickness (that is, $t1+t2_U+tgc+t2_L$) of the prepreg of the present invention is determined by the thicknesses of the different layers, but is preferably 20 to 100 µm, more preferably 25 to 80 µm, particularly preferably 30 to 60 µm.

As the method of applying the first resin composition and the second resin composition, dip coat, roll coat, curtain coat, die coat, slit coat, gravure coat, etc. may be mentioned.

Further, the drying temperature of drying them, after applying etc. the first resin composition and second resin composition, is preferably made a temperature of an extent where the first resin composition and second resin composition do not cure, but is usually 20 to 300° C., preferably 30 to 200° C. Further, the drying time is usually 30 seconds to 1 hour, preferably 1 minute to 30 minutes.

Note that, in the prepreg of the present invention, the first resin layer 10 and second resin layer 20 (B layer 21, fiber base material-containing layer 22, and A layer 23) which form the prepreg are preferably in an uncured or semicured state. By making these the uncured or semicured state, the adherability of the first resin layer and the second resin layer which form the prepreg of the present invention and the adherability of the second resin layer 20 (layer acting as adhesive layer) and substrate can be made high. Here, "uncured" means the state where when dipping a prepreg of the present invention in a solvent which is able to dissolve the first resin (for example, polar group-containing alicyclic olefin polymer (A1)) and a solvent which is able to dissolve the second resin (for example, polar group-containing alicyclic olefin polymer (B1)), substantially all of the first resin and second resin dissolve. Further, "semicured" means the state of being cured halfway to an extent enabling further curing upon heating, preferably a state where parts of the first resin and second resin (specifically, amounts of 7 wt % or more and amounts where parts remain) are dissolved in a solvent able to dissolve the first resin and a solvent able to dissolve the second resin or a state where the volume after dipping the shaped article in the solvent for 24 hours is 200% or more of the volume before dipping (swell rate).

Even when the first resin layer 10 and second resin layer 20 which form the prepreg of the present invention are uncured or semicured in state, from viewpoint of making the adherability of the second resin layer 20 better while keeping the first resin layer 10 from flowing when heating and laminating the prepreg of the present invention on the substrate at the surface of the second resin layer 20 side, the viscosity of the first resin composition (viscosity in case of not containing volatile ingredient such as organic solvent) is preferably made one higher than the viscosity of the second resin composition. In particular, in the present invention, by making the first resin layer 10 a thickness t1 of 7 µm or less and making the variation of thickness ±1 µm in range and making the viscosity of the first resin composition which forms the first resin layer 10 higher than the viscosity of the second resin composition which forms the second resin layer 20, when heating and laminating the prepreg of the present invention on the substrate at the surface of the second resin layer 20 side, it is possible to improve the adherability at the second resin layer 20 side, while the first resin layer 10 does not become fluid, so the flatness can be maintained. For this reason, the cured shaped article which is obtained by curing the prepreg of the present invention can be made one which is small in variation of surface roughness, excellent in surface flatness, and can form a plated conductor layer which is substantially free from uneven plating.

Further, regarding the viscosity of the first resin composition which forms the first resin layer 10 and the viscosity of the second resin composition which forms the second resin layer 20, the viscosity of the first resin composition is preferably made to become higher than the viscosity of the second resin composition by suitably adjusting the formulation of the composition etc., but suitably, as the viscosity of the second resin composition used in the present invention, the minimum melt viscosity at 100° C. to 130° C. in range is preferably less than 3000 Pa·s, more preferably less than 1000 Pa·s, furthermore preferably less than 500 Pa·s, particularly preferably less than 100 Pa·s. The lower limit is normally made 10 Pa·s or so. On the other hand, the viscosity of the first resin composition is made 3000 Pa·s or more. Furthermore, the difference of viscosity of the first resin composition and the second resin composition is preferably 500 Pa·s or more. By making the viscosities of the first resin composition and the second resin composition in this range, when heating and laminating the prepreg of the present invention on the substrate, the first resin layer does not flow and the first resin layer becomes hard to change in thickness, while the second resin layer exhibits fluidity, so the laminated flatness on a substrate with relief shapes becomes good. Note that, the viscosity can be measured by a rotary type rheometer or other viscoelasticity measuring device.

(Laminate)

The laminate of the present invention is obtained by laminating the above-mentioned prepreg of the present invention on a base material through the surface of the second resin layer side. The laminate of the present invention should be one which is comprised of at least the above-mentioned prepreg of the present invention which is laminated, but is preferably one obtained by laminating a substrate which has a conductor layer on its surface and an electrical insulating layer which is comprised of the cured product of the prepreg of the present invention. Note that, at this time, the prepreg of the present invention is configured laminated with the substrate through the second resin layer, so the surface of the electrical insulating layer is made one which is formed by the first resin layer among the first resin layer and second resin layer of the prepreg of the present invention.

The substrate which has a conductor layer on its surface is one which has a conductor layer on the surface of an electrical insulating substrate. The electrical insulating substrate is formed by curing a resin composition which contains a known electrical insulating material (for example, alicyclic olefin polymer, epoxy resin, maleimide resin, (meth)acrylic resin, diallyl phthalate resin, triazine resin, polyphenyl ether, glass, etc.). The conductor layer is not particularly limited, but is usually a layer which includes wiring which are formed by a conductive metal or other conductor and may further include various circuits as well. The configurations, thicknesses, etc. of the wiring and circuits are not particularly limited. As specific examples of a substrate which has a conductor layer on its surface, a printed circuit board, silicon wafer board, etc. may be mentioned. The substrate which has a conductor layer on its surface has a thickness of usually 10 to 10 mm, preferably 20 µm to 5 mm, more preferably 30 µm to 2 mm.

The substrate which has a conductor layer on its surface used in the present invention is preferably pretreated on the surface of the conductor layer so as to improve the adhesion with the electrical insulating layer. As the method of pretreatment, known art can be used without particular limitation. For example, if the conductor layer is comprised of copper, the oxidizing method of bringing a strong alkaline oxidizing solution into contact with the conductor layer surface to form a layer of copper oxide on the conductor surface and roughen it, the method of oxidizing the conductor layer surface by the previous method, then reducing it by sodium borohydride, formalin, etc., the method of depositing plating on the conductor layer to roughen it, the method of bringing an organic acid into contact with the conductor layer to dissolve the grain boundaries of the copper and roughen the layer, the method of forming a primer layer on the conductor layer by a thiol compound, silane compound, etc. and the like may be mentioned. Among these, from the viewpoint of the ease of maintaining the shapes of fine wiring patterns, the method of bringing an organic acid into contact with the conductor layer to dissolve the grain boundaries of the copper and roughen the layer and the method of using thiol compounds or silane compounds etc. to form a primer layer are preferable.

The laminate of the present invention can usually be produced by hot pressing the prepreg of the present invention on a substrate which has a conductor layer on its surface.

As the method of hot pressing, the method of superposing the prepreg with the support so that the second resin layer which forms the prepreg is contiguous with the conductor layer of the substrate explained above and using a press laminator, press machine, vacuum laminator, vacuum press, roll laminator, or other pressure device for hot pressing (lamination) may be mentioned. By hot pressing, it is possible to join the conductor layer on the substrate surface and the insulating adhesive film with substantially no clearance at their interface.

The temperature of the hot pressing operation is usually 30 to 250° C., preferably 70 to 200° C., the applied pressure is usually 10 kPa to 20 MPa, preferably 100 kPa to 10 MPa, and the pressing time is usually 30 seconds to 5 hours, preferably 1 minute to 3 hours. Further, the hot pressing is preferably performed under reduced pressure so as to improve burying wiring patterns into the insulating adhesive film or prepreg and prevent the formation of bubbles. The pressure of the reduced pressure under which the hot pressing is performed is usually 100 kPa to 1 Pa, preferably 40 kPa to 10 Pa. According to the above hot pressing operation, by suitably adjusting the temperature conditions etc., it is possible to laminate the prepreg of the present invention on a base material in the uncured state, semicured state, or cured state.

The thus obtained laminate of the present invention is obtained using the above-mentioned prepreg of the present invention, so is small in variation of surface roughness, high in surface flatness, and excellent in formability of conductor layer with substantially no uneven plating. For this reason, this can be suitably used for application as an electrical insulating layer of a multilayer circuit board.

(Multilayer Circuit Board)

Below, the method of production of a multilayer circuit board which is obtained using the laminate of the present invention will be explained.

First, the laminate of the present invention is formed with via holes or through holes which pass through the electrical insulating layer. The via holes are formed for connecting the different conductor layers which form a multilayer circuit board when forming a multilayer circuit board. The via holes and through holes can be formed by chemical treatment such as photolithography or by physical treatment such as drilling, laser irradiation, and plasma etching. Among these methods, the method using a laser ($CO_2$ gas laser, excimer laser, UV-YAG laser, etc.) enables fine via holes to be formed without causing a drop in the characteristics of the electrical insulating layer, so this is preferred.

Next, the electrical insulating layer of the laminate, specifically the surface of the first resin layer of the prepreg which forms the laminate, is roughened by surface roughening treatment. The surface roughening treatment is performed so as to enhance the adhesion with the conductor layer which is formed on the electrical insulating layer.

The electrical insulating layer has a surface average roughness Ra of preferably 0.05 μm to less than 0.5 μm, more preferably 0.06 μm to less than 0.3 μm, while the surface 10-point average roughness Rzjis is preferably 0.3 μm to less than 4 μm, more preferably 0.5 μm to less than 2 μm. Note that, in this Description, Ra is the arithmetic average roughness which is shown in JIS B 0601-2001. The surface 10-point average roughness Rzjis is the 10-point average roughness which is shown in JIS B 0601-2001 Annex 1.

The method of surface roughening treatment is not particularly limited, but the method of bringing the surface of the electrical insulating layer (that is, the surface of the first resin layer of the prepreg) into contact with an oxidizing compound etc. may be mentioned. As the oxidizing compound, an inorganic oxidizing compound or organic oxidizing compound or other known compound which has an oxidizing ability may be mentioned. From the ease of control of the surface average roughness of the electrical insulating layer, use of an inorganic oxidizing compound or organic oxidizing compound is particularly preferable. As the inorganic oxidizing compound, a permanganate, chromic acid anhydride, dichromate, chromate, persulfate, active manganese dioxide, osmium tetraoxide, hydrogen peroxide, periodide, etc. may be mentioned. As the organic oxidizing compound, dicumyl peroxide, octanoyl peroxide, m-chloroperbenzoate, peracetate, ozone, etc. may be mentioned.

The method of using an inorganic oxidizing compound or organic oxidizing compound to roughen the surface of the electrical insulating layer is not particularly limited. For example, the method of dissolving the above oxidizing compound in a solvent which can dissolve it so as to prepare an oxidizing compound solution and bringing this into contact with the surface of the electrical insulating layer may be mentioned.

The method of bringing the oxidizing compound solution into contact with the surface of the electrical insulating layer is not particularly limited, but, for example, the dipping method of dipping the electrical insulating layer in the oxidizing compound solution, the buildup method of utilizing the surface tension of the oxidizing compound solution to place the oxidizing compound solution on the electrical insulating layer, the spraying method of spraying the oxidizing compound solution on the electrical insulating layer, or any other method may also be used. By performing the surface roughening treatment, it is possible to improve the adhesion of the electrical insulating layer with the conductor layer and other layers.

The temperature and the time by which these oxidizing compound solutions are brought into contact with the surface of the electrical insulating layer may be freely set by considering the concentration and type of the oxidizing compound, method of contact, etc., but the temperature is usually 10 to 150° C., preferably 20 to 100° C., while the time is usually 0.5 to 60 minutes, preferably 1 to 40 minutes.

Note that, to remove the oxidizing compound after the surface roughening treatment, the surface of the electrical insulating layer after the surface roughening treatment is washed with water. Further, when a substance which cannot be washed off by just water is deposited on the surface, the surface is further washed by a washing solution which can dissolve that substance or another compound is brought into contact with the surface to convert the substance into one which can be dissolved in water and then the surface is washed by water. For example, when bringing an aqueous solution of potassium permanganate or an aqueous solution of sodium permanganate or other alkali aqueous solution into contact with the electrical insulating layer, to remove the film of manganese dioxide which is formed, it is possible to using a mixed solution of hydroxylamine sulfate and sulfuric acid or other acidic aqueous solution to neutralize/reduce the surface, then wash it by water.

Next, after the electrical insulating layer of the laminate is treated to roughen its surface, a conductor layer is formed on the surface of the electrical insulating layer (that is, the surface of the first resin layer of the prepreg) and the inside wall surfaces of the via holes or through holes.

The method of formation of the conductor layer is performed, from the viewpoint of enabling formation of a conductor layer which is excellent in adhesion, using the electroless plating method.

For example, when using electroless plating to form a conductor layer, first, before forming a metal thin layer on the surface of the electrical insulating layer, the general practice has been to deposit silver, palladium, zinc, cobalt, or another catalyst nuclei on the electrical insulating layer (that is, first resin layer of prepreg). The method of depositing catalyst nuclei on the electrical insulating layer is not particularly limited, but, for example, the method of dipping the article in a solution obtained by dissolving silver, palladium, zinc, cobalt, or other metal compounds or their salts or complexes in water, alcohol, chloroform or another organic solvent in 0.001 to 10 wt % in concentration (in accordance with need, also possibly including an acid, alkali, complexing agent, reducing agent, etc.), then reducing the metal etc. may be mentioned.

As the electroless plating solution which is used in the electroless plating, a known self-catalyst type electroless plating solution may be used. It is not particularly limited in the type of metal, the type of reducing agent, the type of complexing agent, the concentration of hydrogen ions, the concentration of dissolved oxygen, etc. which are contained in the plating solution. For example, an electroless copper plating solution which contains ammonium hypophosphite, hypophosphoric acid, ammonium borohydride, hydrazine, formalin, etc. as a reducing agent; an electroless nickel-phosphorus plating solution which contains sodium hypophosphite as a reducing agent; an electroless nickel-boron plating solution which contains dimethylamineborane as a reducing agent; an electroless palladium plating solution; an electroless palladium-phosphorus plating solution which contains sodium hypophosphite as a reducing agent; an electroless gold plating solution; an electroless silver plating solution; an electroless nickel-cobalt-phosphorus plating solution which contains sodium hypophosphite as a reducing agent, or other electroless plating solution can be used.

After forming the metal thin layer, the substrate surface may be brought into contact with a rustproofing agent to make it rustproof. Further, after forming the metal thin layer, the metal thin layer may be heated to raise the adhesiveness. The heating temperature is usually 50 to 350° C., preferably 80 to 250° C. Note that, at this time, the heating may be performed under pressed conditions. As the pressing method at this time, for example, the method of using a hot press, a pressurizing and heating roll, and other physical pressing means may be mentioned. The pressure which is applied is usually 0.1 to 20 MPa, preferably 0.5 to 10 MPa. If this range, high adhesion can be secured between the metal thin layer and the electrical insulating layer.

The thus formed metal thin layer is formed with a plating-use resist pattern and the plating is further grown over it by electroplating or other wet plating (thickening plating). Next, the resist is removed and the surface is further etched to etch the metal thin layer into the pattern shapes and form the conductor layer. Therefore, the conductor layer which is formed by this method is usually comprised of the patterned metal thin layer and the plating which is grown over that.

For example, using the above obtained multilayer circuit board as the substrate for producing the above-mentioned laminate, the prepreg of the present invention is hot pressed on this and cured to form an electrical insulating layer and the above-mentioned method is used to form a conductor layer over this. By repeating these steps, it is possible to further increase the number of layers. Due to this, the desired multilayer circuit board can be obtained.

Note that, in the above, the technique of making the thicknesses $t2_U$ of the B layer 21 thinner than the thickness t1 of the first resin layer 10 to provide a prepreg which can give a cured shaped article which is small in variation of surface roughness, excellent in surface flatness, and can form a plated conductor layer substantially free of uneven plating was explained, but a technique which controls the thickness $t2_U$ of the B layer to over 0 µm to 2 µm may also be used. Alternatively, instead of these techniques, the technique which controls the thickness $t2_L$ of the A layer 23 to 25% or more of the total thickness of the prepreg (that is, $t1+t2_U+tgc+t2_L$) or the technique which controls the thickness of the first resin layer 10 to 7 µm or less and the variation of thickness to ±1 µm and makes the viscosity of the first resin composition which forms the first resin layer 10 higher than the viscosity of the second resin composition which forms the second resin layer 20 may also be used.

EXAMPLES

Below, examples and comparative examples will be given to more specifically explain the present invention. Note that, in the examples, the "parts" and "%", unless particularly indicated otherwise, are based on weight. The various types of properties were evaluated by the following methods.

(1) Number Average Molecular Weight (Mn) and Weight Average Molecular Weight (Mw) of Alicyclic Olefin Polymer The alicyclic olefin polymer was measured for number average molecular weight (Mn) and weight average molecular weight (Mw) by gel permeation chromatography (GPC) using tetrahydrofuran as a developing solvent. These were found as values converted to polystyrene.

(2) Hydrogenation Ratio of Alicyclic Olefin Polymer

The ratio of the number of moles of the unsaturated bonds which were hydrogenated with respect to the number of moles of the unsaturated bonds in the polymer before the hydrogenation was found by measurement of the 400 MHz $^1$H-NMR spectrum. This was used as the hydrogenation ratio.

(3) Content of Monomer Units Having Carboxylic Anhydride Groups in Alicyclic Olefin Polymer The ratio of the number of moles of the monomer units which have carboxylic anhydride groups with respect to the number of moles of total monomer units in the polymer was found by measurement of the 400 MHz $^1$H-NMR spectrum. This was used as the content of monomer units having carboxylic anhydride groups of the polymer.

(4) Melt Viscosity

The varnish of the first resin resin composition and the varnish of the second resin composition were applied on a thickness 38 μm polyethylene terephthalate film and dried in a nitrogen atmosphere at 80° C. for 10 minutes to obtain a film with support. Further, just the different compositions were collected from the film and press formed to prepare thickness 600 μm plate-shaped samples. The dynamic viscoelasticity was measured using a Jasco International VAR100 VISCOANALYSER ETC-3 at a temperature elevation rate of 5° C./minute, a starting temperature 50° C., a measurement temperature interval of 2.5° C., and a vibration of 1 Hz/deg. The lowest melt viscosity at 100° C. to 130° C. was evaluated by the following criteria.

A: Less than 500 Pa·s
B: 500 Pa·s to less than 1000 Pa·s
C: 1000 Pa·s or more (5) Variation of Thickness of First Resin Layer A cross-section of the obtained prepreg was observed by an optical microscope to thereby measure the variation of thickness of the first resin layer. This was evaluated by the following criteria.

Good: Less than ±0.5 μm
Fair: ±0.5 μm to less than ±1 μm
Poor: Over ±1 μm or impregnation in fiber base material (6) Surface Roughness of First Resin Layer (Arithmetic Average Roughness Ra)

Copper of the multilayer printed circuit board surface was dissolved by an ammonium persulfate solution. The obtained first resin layer surface was measured for surface roughness (arithmetic average roughness Ra) using a surface shape measuring device (made by Veeco Instruments, Inc., WYKO NT1100) in a measurement range of 91 μm×120 μm at five locations. The maximum value of surface roughness obtained as a result of measurement was evaluated by the following criteria.

Good: Ra of less than 300 nm
Fair: Ra of 300 nm to less than 500 nm
Poor: Ra of 500 nm or more (7) Variation of Surface Roughness (Arithmetic Average Roughness Ra) of First Resin Layer The difference between the maximum value and minimum value of the measured values of surface roughness (arithmetic average roughness Ra) at five locations obtained by the measurement of the above (6) was calculated. This was evaluated by the following criteria.

Good: Difference of maximum value and minimum value of Ra of less than 50 nm
Fair: Difference of maximum value and minimum value of Ra of 50 nm to less than 150 nm
Poor: Difference of maximum value and minimum value of Ra of 150 nm or more (8) Unevenness of Plated Conductor Layer (Unevenness of Plating)

The peel off strength (peel strength) between the insulating layer and copper plating layer of the multilayer printed circuit board was measured in accordance with JIS C6481-1996 at five locations.

The multilayer printed circuit board being measured is in each case formed by a similar material. At each measured multilayer printed circuit board, if there is no difference in the peel strength at the different measurement points, the average value can be considered to show a uniform value. On the other hand, if there is a difference in level of peel strength at each measurement point, it is considered that average value of the peel strength falls.

Therefore, the average value of the peel strengths of five locations of the multilayer printed circuit board was evaluated by the following criteria. The lower the value of the average value, the larger the unevenness of plating judged.

Good: Peel strength of 5N/cm or more
Fair: Peel strength of 3N/cm to less than 5N/cm
Poor: Peel strength of less than 3N/cm (9) Observation of Cross-Section of Multilayer Printed Circuit Board (Contact of Glass Cloth and Conductor Wiring)

A cross-section of the multilayer printed circuit board was observed. This was evaluated by the following criteria.

Good: Fiber base material did not contact conductor wiring.
Poor: Fiber base material contacted conductor wiring.

Synthesis Example 1

As a first stage of polymerization, 5-ethylidene-bicyclo[2.2.1]hept-2-ene(EdNB) 35 molar parts, 1-hexene 0.9 molar part, anisole 340 molar parts, and 4-acetoxybenzylidene(dichloro)(4,5-dibromo-1,3-dimesityl-4-imidazolin-2-ylidene)(tricyclohexylphosphine)ruthenium (C1063, made by Wako Pure Chemicals Industries, Ltd.) 0.005 molar part were charged into a nitrogen-substituted pressure-resistant glass reactor where they were stirred at 80° C. for 30 minutes for a polymerization reaction to obtain a solution of a norbornene-based ring-opening polymer.

Next, as a second stage of polymerization, to the solution which was obtained in the first stage of polymerization, tetracyclo[9.2.1.0$^{2,10}$.0$^{3,8}$]tetradeca-3,5,7,12-tetraene (MTF) 35 molar parts, bicyclo[2.2.1]hept-2-ene-5,6-dicarboxylic anhydride (NDCA) 30 molar parts, anisole 250 molar parts, and 0.01 molar part of C1063 were added and stirred at 80° C. for 1.5 hours for a polymerization reaction to obtain a solution of a norbornene-based ring-opening polymer. This solution was measured by gas chromatography, whereupon it was confirmed that substantially no monomers remained. The polymerization conversion rate was 99% or more.

Next, to a nitrogen-substituted mixer-equipped autoclave, the obtained solution of the ring-opening polymer was charged, 0.03 molar part of C1063 was added, and the mixture was stirred at 150° C. under a hydrogen pressure of 7 MPa for 5 hours to perform a hydrogenation reaction and obtain a solution of a hydrogenation product of a norbornene-based ring-opening polymer constituted by an alicyclic olefin polymer (P-1). The obtained polymer (P-1) had a weight average molecular weight of 60,000, a number average molecular weight of 30,000, and a molecular weight distribution of 2. Further, the hydrogenation rate was 95%, while the content of the monomer units which have carboxylic acid anhydride groups was 30 mol %. The solution of the polymer (P-1) had a solid content concentration of 22%.

Synthesis Example 2

Tetracyclo[9.2.1.0$^{2,10}$.0$^{3,8}$]tetradeca-3,5,7,12-tetraene (MTF) 70 molar parts, bicyclo[2.2.1]hept-2-ene-5,6-dicarboxylic anhydride (NDCA) 30 molar parts, 1-hexene 0.9 molar part, anisole 590 molar parts, and 0.015 molar part of C1063 were charged into a nitrogen-substituted pressure-resistant glass reactor where they were stirred at 80° C. for 1 hour for a polymerization reaction to obtain a solution of a norbornene-based ring-opening polymer. This solution was measured by gas chromatography, whereupon it was confirmed that there were substantially no monomers remaining. The polymerization conversion rate was 99% or more.

Next, to a nitrogen-substituted mixer-equipped autoclave, the obtained solution of the ring-opening polymer was charged. This was stirred at 150° C. at a hydrogen pressure of 7 MPa for 5 hours for a hydrogenation reaction to obtain a solution of a hydrogenation product of a norbornene-based ring-opening polymer constituted by the alicyclic olefin polymer (P-2). The obtained polymer (P-2) had a weight average molecular weight of 50,000, a number average molecular weight of 26,000, and a molecular weight distribution of 1.9. Further, the hydrogenation rate was 97%, while the content of the monomer units which had carboxylic anhydride groups was 30 mol %. The solution of the polymer (P-2) had a solid content concentration of 22%.

Synthesis Example 3

Tetracyclo[9.2.1.0$^{2,10}$.0$^{3,8}$]tetradeca-3,5,7,12-tetraene (MTF) 70 molar parts, bicyclo[2.2.1]hept-2-ene-5,6-dicarboxylic anhydride (NDCA) 30 molar parts, 1-hexene 6 molar parts, anisole 590 molar parts, and 0.015 molar part of C1063 were charged into a nitrogen-substituted pressure-resistant glass reactor where they were stirred at 80° C. for 1 hour for a polymerization reaction to obtain a solution of a ring-opening polymer. This solution was measured by gas chromatography, whereupon it was confirmed that substantially no monomers remained. The polymerization conversion rate was 99% or more.

Next, to a nitrogen-substituted mixer-equipped autoclave, the obtained solution of the ring-opening polymer was charged. This was stirred at 150° C. under a hydrogen pressure of 7 MPa for 5 hours to perform a hydrogenation reaction. Next, the obtained hydrogenation reaction solution was concentrated to obtain a solution of the alicyclic olefin polymer (P-3). The obtained alicyclic olefin polymer (P-3) had a weight average molecular weight of 10,000, a number average molecular weight of 5,000, and a molecular weight distribution of 2. Further, the hydrogenation rate was 97%, while the content of monomer units which had carboxylic acid anhydride groups was 30 mol %. The solution of the alicyclic olefin polymer (P-3) had a solid content concentration of 55%.

Example 1

(Preparation of First Resin Composition)

A solution of the alicyclic olefin polymer (P-1) which was obtained in Synthesis Example 1, 45 parts and 6 parts of silica slurry which was obtained by mixing an inorganic filler constituted by untreated spherical silica (Admafine (Registered Trademark) SO—Cl, made by Admatechs Company Limited, volume average particle diameter 0.25 μm) 98% and the alicyclic olefin polymer (P-2) which was obtained in Synthesis Example 2, 2% in anisole so as to give a solid content of 75% and dispersing them by a high pressure homogenizer were mixed and stirred by a planetary type mixer for 3 minutes.

To this, a curing agent constituted by a dicyclopentadiene type multifunctional epoxy resin (EPICLON HP-7200L, made by DIC Corporation, epoxy equivalents: 242 to 252) 3.5 parts, a laser processability enhancing agent constituted by 2-[2-hydroxy-3,5-bis(α,α-dimethylbenzyl)phenyl]-2H-benzotriazole 0.1 part, a hindered phenol compound constituted by tris-(3,5-di-t-butyl-4-hydroxybenzyl)-isocyanulate (IRGANOX (Registered Trademark) 3114, made by BASF) 0.1 part, a hindered amine compound constituted by tetrakis (1,2,2,6,6-pentamethyl-4-piperidyl)1,2,3,4-butanetetracarboxylate (Adekastab (Registered Trademark) LA52, made by ADEKA CORPORATION) 0.05 part, and anisole 75.2 parts were mixed and stirred by a planetary type mixer for 3 minutes.

Furthermore, to this, a solution in which a curing accelerator constituted by 1-benzyl-2-phenylimidazole was dissolved 50% in anisole 0.1 part was mixed. The mixture was stirred by a planetary type mixer for 5 minutes to obtain a varnish of a first resin composition.

(Preparation of Second Resin Composition)

A solution of the alicyclic olefin polymer (P-2) which was obtained in Synthesis Example 2, 9.1 parts and 84.6 parts of silica slurry which was obtained by mixing an inorganic filler (B3) constituted by surface-treated spherical silica (Admafine (Registered Trademark) SC-2500-SXJ, made by Admatechs Company Limited, aminosilane type silane coupling agent-treated product, volume average particle diameter 0.5 μm) 98.5% and the alicyclic olefin polymer (P-3) which was obtained in Synthesis Example 3, 1.5% in anisole so as to give a solid content of 78% and treating them by a high pressure homogenizer were mixed and stirred by a planetary type mixer for 3 minutes.

To this, a curing agent constituted by bisphenol A type epoxy resin (Epicoat (Registered Trademark) 828EL, made by Mitsubishi Chemical Corporation, epoxy equivalents: 184 to 194) 3 parts, multifunctional epoxy resin (1032H60, made by Mitsubishi Chemical Corporation, epoxy equivalents: 163 to 175) 3 parts, dicyclopentadiene type multifunctional epoxy resin (EPICLON HP-7200L) 11 parts, an antiaging agent constituted by tris-(3,5-di-t-butyl-4-hydroxybenzyl)-isocyanulate 0.1 part, dicyclopentadiene type novolac resin (GDP-6140, made by Gun Ei Chemical Industry Co., Ltd.) 15 parts, and anisole 2.4 pars were mixed and stirred by a planetary type mixer for 3 minutes. Furthermore, to this, a solution in which a curing accelerator constituted by 1-benzyl-2-phenylimidazole was dissolved 50% in anisole 0.3 part was mixed. The mixture was stirred by a planetary type mixer for 5 minutes to obtain a varnish of a second resin composition.

(Preparation of Prepreg)

The above obtained varnish of the first resin composition was applied on a thickness 38 μm polyethylene terephthalate film (support) using a wire bar, then this was dried in a nitrogen atmosphere at 85° C. for 5 minutes to obtain a film with the support on which is formed a first resin layer 10 (see FIG. 1) which is comprised of an uncured first resin composition. Note that, the thickness t1 of the first resin layer 10 was 6 μm.

Next, a glass cloth (Cloth Type #1027, thickness 20 μm, basis weight 19 g/m$^2$) was superposed on the film with the support at the surface where the first resin layer 10 was formed, then the above obtained varnish of the second resin composition was applied on this using a doctor blade (made by Tester Sangyo Co., Ltd) and auto film applicator (made by Tester Sangyo Co., Ltd) while impregnating the glass cloth. Next, this was dried in a nitrogen atmosphere at 80° C. for 10 minutes to form, in order from the support, as shown in FIG. 1, the first resin layer 10, B layer 21, fiber base material-containing layer 22, and A layer 23 to obtain a total thickness 45 μm prepreg. Further, the obtained prepreg was measured for thickness variation in the surface of the first resin layer 10 by the above method. The results are shown in Table 1. Further, the obtained prepreg was heated at 180° C. for 60 minutes to thereby cause heat curing. A cross-section of the prepreg after the heat curing was measured using an optical microscope. The thicknesses t1, t2$_U$, tgc, and t2$_L$ of the different layers (see FIG. 1) are shown in Table 1. Note that, in the present example, a heat cured prepreg was used to measure the thicknesses of the different layers, but the thicknesses of the layers which form the prepreg do not substantially change before and after the heat curing (similar in Examples 2 to 7 and Comparative Examples 1 to 5).

(Preparation of Laminate)

Next, separate from the above, a thickness 0.8 μm insulating board was provided on its two sides with comb-like patterns of conductor wiring with conductor intervals of 100 μm and conductor heights of 18 μm. The conductor wiring was brought into contact with an organic acid to microetch them and obtain an inside layer substrate.

At the two sides of this inside layer substrate, the above obtained prepregs were superposed so that the surfaces at the A layer 23 sides were at the inside layer substrate sides, then the assembly was pressed by a primary pressing operation. The primary pressing operation was hot pressing by a vacuum laminator which was provided with heat resistant rubber press plates at the top and bottom under a reduced pressure of 200 Pa at a temperature of 110° C. and a pressure of 0.1 MPa for 90 seconds. Furthermore, a hydraulic press apparatus which was provided with metal press plates at the top and bottom was used to hot press the assembly at a press bonding temperature of 110° C. and 1 MPa for 90 seconds. Next, the support was peeled off to thereby obtain a laminate of prepreg layers and an inside layer substrate. Furthermore, the laminate was allowed to stand in an air atmosphere at 180° C. for 60 minutes and the first resin layer 10 and second resin layer 20 which were contained in the prepreg were made to cure to form electrical insulating layers on the inside layer substrate.

(Swelling Treatment Step)

The obtained laminate was dipped while shaking in a 60° C. aqueous solution which was prepared to contain a swelling solution ("Swelling Dip Securiganth P", made by Atotech, "Securiganth" is a registered trademark) 500 ml/liter and sodium hydroxide 3 g/liter for 15 minutes, then was rinsed.

(Oxidizing Treatment Step)

Next, the laminate which was treated for swelling was dipped while shaking in an 80° C. aqueous solution which was prepared to contain an aqueous solution of permanganate ("Concentrate Compact CP", made by Atotech) 500 ml/liter and a concentration of sodium hydroxide of 40 g/liter for 20 minutes, then was rinsed.

(Neutralizing/Reduction Treatment Step)

Next, the laminate which was treated by oxidation was dipped in a 40° C. aqueous solution which was prepared to contain an aqueous solution of hydroxylamine sulfate ("Reduction Securiganth P 500", made by Atotech, "Securiganth" is a registered trademark) 100 ml/liter and sulfuric acid 35 ml/liter for 5 minutes to neutralize and reduce it, then was rinsed.

(Cleaner/Conditioner Step)

Next, the laminate which was treated by neutralization/reduction was dipped in a 50° C. aqueous solution which was prepared to contain a cleaner/conditioner aqueous solution ("Alcup MCC-6-A", made by Uyemura & Co., Ltd. "Alcup" is a registered trademark) of a concentration of 50 ml/liter for 5 minutes to treat it with the cleaner and conditioner. Next, the laminate was dipped in 40° C. rinsing water for 1 minute, then was rinsed.

(Soft Etching Step)

Next, the laminate which was treated by the cleaner/conditioner was dipped in an aqueous solution which was prepared to contain a sulfuric acid concentration of 100 g/liter and sodium persulfate of 100 g/liter for 2 minutes to be soft etched, then was rinsed.

(Pickling Step)

Next, the laminate which was treated by soft etching was dipped in an aqueous solution which was prepared to contain a sulfuric acid concentration of 100 g/liter for 1 minute to be pickled, then was rinsed.

(Catalyst Imparting Step)

Next, the laminate which was treated by pickling was dipped in a 60° C. Pd salt-containing plating catalyst aqueous solution which was prepared to contain Alcup Activator MAT-1-A (product name, made by Uyemura & Co., Ltd. "Alcup" is a registered trademark) 200 ml/liter, Alcup Activator MAT-1-B (product name, made by Uyemura & Co., Ltd. "Alcup" is a registered trademark) 30 ml/liter, and sodium hydroxide 0.35 g/liter for 5 minutes, then was rinsed.

(Activation Step)

Next, the laminate which was treated by catalyst imparting was dipped in an aqueous solution which was prepared to contain Alcup Reducer MAB-4-A (product name, made by Uyemura & Co., "Alcup" is a registered trademark) 20 ml/liter and Alcup Reducer MAB-4-B (product name, made by Uyemura & Co., Ltd. "Alcup" is a registered trademark) 200 ml/liter at 35° C. for 3 minutes to reduce the plating catalyst, then was rinsed.

(Accelerator Treatment Step)

Next, the laminate which was treated by activation was dipped in an aqueous solution which was prepared to contain Alcup Accelerator MEL-3-A (product name, made by Uyemura & Co., Ltd. "Alcup" is a registered trademark) 50 ml/liter at 25° C. for 1 minute.

(Electroless Plating Step)

The thus obtained laminate was dipped in an electroless copper plating solution which was prepared to contain Thru-Cup PEA-6-A (product name, made by Uyemura & Co., Ltd. "Thru-Cup" is a registered trademark) 100 ml/liter, Thru-Cup PEA-6-B-2X (product name, made by Uyemura & Co. Ltd.) 50 ml/liter, Thru-Cup PEA-6-C (product name, made by Uyemura & Co. Ltd.) 14 ml/liter, Thru-Cup PEA-6-D (product name, made by Uyemura & co. Ltd.) 15 ml/liter, Thru-Cup PEA-6-E(product name, made by Uyemura & Co. Ltd.) 50 ml/liter, and 37% formalin aqueous solution 5 ml/liter, while blowing in air, at a temperature of 36° C. for 20 minutes for electroless copper plating so as to form an electroless plating film on the laminate surface (surface of first resin layer 10 comprised of first resin composition). Next, the laminate was annealed in an air atmosphere at 150° C. for 30 minutes.

The annealed laminate was electroplated with copper to form a thickness 30 μm electroplated copper layer. Next, the laminate was heat treated at 180° C. for 60 minutes to thereby obtain a two-sided two-layer multilayer printed circuit board comprised of a laminate on which circuits are formed by conductor layers which are comprised of metal thin film layers and electroplated copper layers. The obtained multilayer printed circuit board was evaluated by the above methods for the surface roughness of first resin layer (arithmetic average roughness Ra), the variation of the surface roughness of first resin layer (arithmetic average roughness Ra), the bondability of insulating layer and the metal layer (peel strength), and contact of the glass cloth and conductor layer by observation of the cross-section. The results are shown in Table 1.

Example 2

A varnish of a first resin composition which was obtained in the same way as Example 1 was used to obtain a film with the support which was formed with a first resin layer 10 with a thicknesses t1 of 3 μm. Further, the surface of the obtained film with the support on which the first resin layer 10 was formed was coated with the varnish of the second resin composition which was obtained in the same way as Example 1 by using a wire bar, then glass cloth (Cloth Type #1027, thickness 20 μm, basis weight 19 g/m²) was superposed on this and bonded to it. Next, furthermore, the varnish of the second resin composition was applied on this using a doctor blade (made by Tester Sangyo Co., Ltd) and an auto film applicator (made by Tester Sangyo Co., Ltd). Next, this was dried in a nitrogen atmosphere at 80° C. for 10 minutes to form, in order from the support, as shown in FIG. 1, the first resin layer 10, B layer 21, fiber base material-containing layer 22, and A layer 23 to obtain a total thickness 45 μm prepreg. Further, the obtained prepreg was measured for thickness variation in the surface of the first resin layer 10 in the same way as Example 1. The results are shown in Table 1. Further, the obtained prepreg was heated at 180° C. for 60 minutes to thereby cause heat curing. A cross-section of the prepreg after the heat curing was measured using an optical microscope. The thicknesses t1, $t2_U$, tgc, and $t2_L$ of the different layers (see FIG. 1) are shown in Table 1.

Further, the same procedure was followed as in Example 1 to prepare a multilayer printed circuit board. Using the prepared multilayer printed circuit board, the same procedure was followed as in Example 1 for evaluation. The results are shown in Table 1.

Example 3

A varnish of a first resin composition which was obtained in the same way as Example 1 was used to obtain a film with the support on which was formed a first resin layer 10 with a thicknesses t1 of 2.5 μm. Further, a glass cloth (Cloth Type #1000, thickness 10 μm, basis weight 11 g/m²) was superposed on the obtained film with the support at the surface on which the first resin layer 10 was formed, then the varnish of the second resin composition which was obtained in the same way as Example 1 was applied on this using a doctor blade (made by Tester Sangyo Co., Ltd) and an auto film applicator (made by Tester Sangyo Co., Ltd) while impregnating the glass cloth, next, this was dried in a nitrogen atmosphere at 80° C. for 10 minutes to form, in order from the support, as shown in FIG. 1, the first resin layer 10, B layer 21, fiber base material-containing layer 22, and A layer 23 to obtain a total thickness 39.5 μm prepreg. Further, the obtained prepreg was measured for thickness variation in the urface of the first resin layer 10 in the same way as Example 1. The results are shown in Table 1. Further, the obtained prepreg was heated at 180° C. for 60 minutes to thereby cause heat curing. A cross-section of the prepreg after the heat curing was measured using an optical microscope. The thicknesses t1, $t2_U$, tgc, $t2_L$ of the different layers (see FIG. 1) are shown in Table 1.

Further, the same procedure was followed as in Example 1 to prepare a multilayer printed circuit board. Using the prepared multilayer printed circuit board, the same procedure was followed as in Example 1 for evaluation The results are shown in Table 1.

Example 4

A varnish of a first resin composition which was obtained in the same way as Example 1 was used to obtain a film with the support on which was formed a first resin layer 10 with a thicknesses t1 of 6 μm. Further, a varnish of a second resin composition which was obtained in the same way as Example 1 was coated on the obtained film with the support at the surface on which the first resin layer 10 was formed using a wire bar, then a glass cloth (Cloth Type #1035, thickness 30 μm, basis weight 30 g/m²) was superposed on this and bonded to it. Next, furthermore, the varnish of the second resin composition was applied on this using a doctor blade (made by Tester Sangyo Co., Ltd) and an auto film applicator (made by Tester Sangyo Co., Ltd), next, this was dried in a nitrogen atmosphere at 80° C. for 10 minutes to form, in order from the support, shown in FIG. 1, the first resin layer 10, B layer 21, fiber base material-containing layer 22, and A layer 23 to obtain a total thickness 68 μm prepreg. Further, the obtained prepreg was measured for thickness variation in the surface of the first resin layer 10 in the same way as Example 1. The results are shown in Table 1. Further, the obtained prepreg was heated at 180° C. for 60 minutes to thereby cause heat curing. A cross-section of the prepreg after the heat curing was measured using an optical microscope. The thicknesses t1, $t2_U$, tgc, and $t2_L$ of the different layers (see FIG. 1) are shown in Table 1.

Further, the same procedure was followed as in Example 1 to prepare a multilayer printed circuit board. Using the prepared multilayer printed circuit board, the same procedure was followed as in Example 1 for evaluation. The results are shown in Table 1.

Example 5

A varnish of a first resin composition which was obtained in the same way as Example 1 was used to obtain a film with the support on which was formed a first resin layer 10 with a thicknesses t1 of 6 μm.

Further, a varnish of a second resin composition which was obtained in the same way as Example 1 was coated on a thickness 38 μm polyethylene terephthalate film (support) using a doctor blade to prepare a layer which was comprised of the varnish of the second resin composition on the support film, then a glass cloth (Cloth Type #1027, thickness 20 μm, basis weight 19 g/m²) was superposed on this and bonded to it. Next, furthermore, a varnish of the second resin composition was applied on this using a doctor blade, then this was dried in a nitrogen atmosphere at 80° C. for 10 minutes to obtain a prepreg of the second resin composition of a thicknesses of 44 μm.

Next, the prepreg of the second resin composition was superposed at the second resin composition layer side on the film with the support on which the first resin composition layer 10 was formed. A vacuum laminator which was provided with press plates made of heat resistant rubber at the top and bottom was used to reduce the pressure to 200 Pa and laminate the layers by hot press bonding at a temperature of 80° C. and a pressure of 0.1 MPa for 30 seconds. After this, the support which was used at the time of preparation of the prepreg of the second resin composition was peeled off to form in order from the support, shown in FIG. 1, the first resin layer 10, B layer 21, fiber base material-containing layer 22, and A layer 23 to obtain a total thickness 50 µm prepreg. Further, the obtained prepreg was measured for thickness variation in the surface of the first resin layer 10 in the same way as Example 1. The results are shown in Table 1. Further, the obtained prepreg was heated at 180° C. for 60 minutes to thereby cause heat curing. A cross-section of the prepreg after the heat curing was measured using an optical microscope. The thicknesses t1, $t2_U$, tgc, and $t2_L$ of the different layers (see FIG. 1) are shown in Table 1.

Further, the same procedure was followed as in Example 1 to prepare a multilayer printed circuit board. Using the prepared multilayer printed circuit board, the same procedure was followed as in Example 1 for evaluation The results are shown in Table 1.

Example 6

An A layer 23 of a total thickness 50 µm prepreg obtained in the same way as Example 5 was applied with a varnish of a second resin composition which was obtained in the same way as Example 1 by a wire bar, then was dried in a nitrogen atmosphere at 80° C. for 5 minutes to obtain a total thickness 55 µm prepreg. Further, the obtained prepreg was measured for thickness variation in the surface of the first resin layer 10 in the same way as Example 1. The results are shown in Table 1. Further, the obtained prepreg was heated at 180° C. for 60 minutes to thereby cause heat curing. A cross-section of the prepreg after the heat curing was measured using an optical microscope. The thicknesses t1, $t2_U$, tgc, and $t2_L$ of the different layers (see FIG. 1) are shown in Table 1.

Further, the same procedure was followed as in Example 1 to prepare a multilayer printed circuit board. Using the prepared multilayer printed circuit board, the same procedure was followed as in Example 1 for evaluation. The results are shown in Table 1.

Example 7

Preparation of Second Resin Composition

A solution of the alicyclic olefin polymer (P-2) which was obtained in Synthesis Example 2, 20 parts and 31.2 parts of silica slurry which was obtained by mixing an inorganic filler (B3) constituted by surface-treated spherical silica (Admafine (Registered Trademark) SC-2500-SXJ, made by Admatechs Company Limited, aminosilane type silane coupling agent-treated product, volume average particle diameter 0.5 µm) 98.5% and the alicyclic olefin polymer (P-3) which was obtained in Synthesis Example 3, 1.5% in anisole so as to give a solid content of 78% and treating them by a high pressure homogenizer were mixed and stirred by a planetary type mixer for 3 minutes.

To this, a curing agent constituted by bisphenol A type epoxy resin (Epicoat (Registered Trademark) 828EL, made by Mitsubishi Chemical Corporation, epoxy equivalents: 184 to 194) 6.5 parts, multifunctional epoxy resin (1032H60, made by Mitsubishi Chemical Corporation, epoxy equivalents: 163 to 175) 6.5 parts, dicyclopentadiene type multifunctional epoxy resin (EPICLON HP-7200L) 24 parts, an antiaging agent constituted by tris-(3,5-di-t-butyl-4-hydroxybenzyl)-isocyanulate 0.2 part, dicyclopentadiene type novolac resin (GDP-6140, made by Gun Ei Chemical Industry Co., Ltd.) 32.6 parts, and anisole 18 pars were mixed and stirred by a planetary type mixer for 3 minutes. Furthermore, to this, a solution in which a curing accelerator constituted by 1-benzyl-2-phenylimidazole was dissolved 50% in anisole 0.65 part was mixed. The mixture was stirred by a planetary type mixer for 5 minutes to obtain a varnish of a second resin composition.

(Preparation of Prepreg)

A varnish of a first resin composition which was obtained in the same way as Example 1 was used to obtain a film with a support which was formed with a first resin layer 10 with a thicknesses t1 of 5 µm. Further, a glass cloth (Cloth Type #1000, thickness 10 µm, basis weight 11 g/m²) was superposed on the film with the support at the surface where the first resin layer 10 was formed, then the above obtained varnish of the second resin composition was applied on this using a doctor blade while impregnating the glass cloth. Next, this was dried in a nitrogen atmosphere at 80° C. for 10 minutes to form, in order from the support, as shown in FIG. 1, the first resin layer 10, B layer 21, fiber base material-containing layer 22, and A layer 23 to obtain a total thickness 45 µm prepreg. Further, the obtained prepreg was measured for thickness variation in the surface of the first resin layer 10 by the above method. The results are shown in Table 1. Further, the obtained prepreg was heated at 180° C. for 60 minutes to thereby cause heat curing. A cross-section of the prepreg after the heat curing was measured using an optical microscope. The thicknesses t1, $t2_U$, tgc, and $t2_L$ of the different layers (see FIG. 1) are shown in Table 1.

Further, the same procedure was followed as in Example 1 to prepare a multilayer printed circuit board. Using the prepared multilayer printed circuit board, the same procedure was followed as in Example 1 for evaluation. The results are shown in Table 1.

Comparative Example 1

A varnish of a second resin composition which was obtained in the same way as Example 1 was coated on a thickness 38 µm polyethylene terephthalate film (support) using a doctor blade to prepare a layer comprised of the varnish of the second resin composition on the support film, glass cloth (Cloth Type #1027, thickness 20 µm, basis weight 19 g/m²) was superposed on this and bonded to it, and the varnish of the second resin composition was applied on this using a doctor blade. Next, this was dried in a nitrogen atmosphere at 80° C. for 10 minutes to prepare a total thickness 45 µm prepreg. Further, the obtained prepreg was heated at 180° C. for 60 minutes to thereby cause heat curing. A cross-section of the prepreg after the heat curing was measured using an optical microscope. The thicknesses t1, $t2_U$, tgc, and $t2_L$ of the layers (see FIG. 1) are shown in Table 1. Note that, the prepreg which was obtained in Comparative Example 1 did not have the first resin layer 10.

Further, the same procedure was followed as in Example 1 to prepare a multilayer printed circuit board. Using the prepared multilayer printed circuit board, the same procedure was followed as in Example 1 for evaluation. The results are shown in Table 1.

Comparative Example 2

Except for not adding the anisole which was mixed in alone at 75.2 parts in Example 1, the same procedure was followed as in Example 1 to prepare a varnish of the first resin composition.

Further, a glass cloth (Cloth Type #1027, thickness 20 µm, basis weight 19 g/m²) was applied using a two-side coater with the above obtained varnish of the first resin composition to a 4 µm thickness and, further, at the opposite side to this, with the varnish of the second resin composition which was obtained at Example 1. Next, this was dried in a nitrogen atmosphere at 80° C. for 10 minutes to obtain a total thickness 45 µm prepreg. Further, the obtained prepreg was measured for thickness variation in the surface of the first resin layer 10 in the same way as Example 1. The results are shown in Table 1. Further, the obtained prepreg was heated at 180° C. for 60 minutes to thereby cause heat curing. A cross-section of the prepreg after the heat curing was measured using an optical microscope. The thicknesses t1, $t2_U$, tgc, and $t2_L$ (see FIG. 1) are shown in Table 1.

Further, the same procedure was followed as in Example 1 to prepare a multilayer printed circuit board. Using the prepared multilayer printed circuit board, the same procedure was followed as in Example 1 for evaluation. The results are shown in Table 1.

Comparative Example 3

Production of Carrier Material

A varnish of a first resin composition which was obtained in the same way as Example 1 was coated on a thickness 38 µm polyethylene terephthalate film (support) using a wire bar and dried in a nitrogen atmosphere at 85° C. for 2 minutes to obtain a first resin layer film with the support which was formed with a thickness 6 µm first resin layer which was comprised of an uncured first resin composition.

Further, separate from this, the varnish of the second resin composition which was obtained in the same way as Example 1 was coated on a thickness 38 µm polyethylene terephthalate film (support) using a doctor blade and dried in a nitrogen atmosphere at 85° C. for 10 minutes to obtain a second resin layer film with the support which was formed with a thickness 26 µm second resin layer which was comprised of an uncured second resin composition.

(Production of Prepreg)

Further, the thus obtained first resin layer film with the support and second resin layer film with the support were used to sandwich a glass cloth (Cloth Type #1027, thickness 20 µm, basis weight 19 g/m²) in a state backed with supports, then a vacuum laminator which was provided with press plates made of heat resistant rubber at the top and bottom was used to reduce the pressure to 200 Pa and laminate the layers by hot press bonding at a temperature of 80° C. and a pressure of 0.1 MPa for 30 seconds to obtain a prepreg which is formed with a first resin layer, glass cloth, and second resin layer in that order and which has a total thickness of 45 µm. Further, the obtained prepreg was measured for thickness variation in the surface of the first resin layer 10 in the same way as Example 1. The results are shown in Table 1. Further, the obtained prepreg was heated at 180° C. for 60 minutes to thereby cause heat curing. A cross-section of the prepreg after the heat curing was measured using an optical microscope. The thicknesses t1, $t2_U$, tgc, and $t2_L$ of the layers (see FIG. 1) are shown in Table 1.

Further, the same procedure was followed as in Example 1 to prepare a multilayer printed circuit board. Using the prepared multilayer printed circuit board, the same procedure was followed as in Example 1 for evaluation. The results are shown in Table 1.

Comparative Example 4

A varnish of a second resin composition which was obtained in the same way as Example 1 was coated on a thickness 38 µm polyethylene terephthalate film (support) using a doctor blade to prepare a layer which was comprised of the varnish of the second resin composition on a support film and a glass cloth (Cloth Type #1027, thickness 20 µm, basis weight 19 g/m²) was superposed on it and bonded to it. Furthermore, the varnish of the second resin composition was applied on this using the doctor blade. Next, this was dried in a nitrogen atmosphere at 80° C. for 8 minutes to obtain a prepreg of the second resin composition of a total thickness of 44 µm. Furthermore, a varnish of a first resin composition which was obtained in the same way as Example 1 was applied on the second resin composition layer of the prepreg of the second resin composition using a wire blade, then this was dried in a nitrogen atmosphere at 80° C. for 3 minutes. Furthermore, a thickness 38 µm polyethylene terephthalate (support) was superposed on the layer which was comprised of the first resin composition. A vacuum laminator which is provided with press plates made of heat resistant rubber at the top and bottom was used to reduce the pressure to 200 Pa and laminate the layers by hot press bonding at a temperature of 80° C. and a pressure of 0.1 MPa for 30 seconds, then the support which contacts the second resin composition layer was peeled off to prepare a total thickness 45 µm prepreg.

Further, the obtained prepreg was measured for thickness variation in the surface of the first resin layer 10 in the same way as Example 1. The results are shown in Table 1. Further, the obtained prepreg was heated at 180° C. for 60 minutes to thereby cause heat curing. A cross-section of the prepreg after the heat curing was measured using an optical microscope. The thicknesses t1, $t2_U$, tgc, and $t2_L$ of the layers (see FIG. 1) are shown in Table 1.

Further, the same procedure was followed as in Example 1 to prepare a multilayer printed circuit board. Using the prepared multilayer printed circuit board, the same procedure was followed as in Example 1 for evaluation. The results are shown in Table 1.

Comparative Example 5

A varnish of a first resin composition which was obtained in the same way as Example 1 was used to obtain a film with a support which was formed with a first resin layer with a thickness t1 of 2 µm.

Further, a varnish of a second resin composition which was obtained in the same way as Example 1 was coated on a thickness 38 µm polyethylene terephthalate film (support) using a doctor blade to prepare a layer which was comprised of the varnish of the second resin composition on a support film and a glass cloth (Cloth Type #1027, thickness 20 basis weight 19 g/m²) was superposed on it and bonded to it. Next, furthermore, the varnish of the second resin composition was applied on this using a doctor blade and, next, this was dried in a nitrogen atmosphere at 80° C. for 10 minutes to obtain a thickness 48 µm prepreg of the second resin composition.

Next, the prepreg of the second resin composition was superposed at the second resin composition layer side on the film with the support on which the first resin composition layer 10 was formed. A vacuum laminator which is provided with press plates made of heat resistant rubber at the top and bottom was used to reduce the pressure to 200 Pa and laminate the layers by hot press bonding at a temperature of 80° C. and a pressure of 0.1 MPa for 30 seconds. After this, the support which was used for preparation of the prepreg of the second resin composition was peeled off to obtain a prepreg which was formed with, in order from the support, as shown in FIG. 1, the first resin layer 10, the B layer 21, the fiber base material-containing layer 22, and the A layer 23 and which has a total thickness of 50 μm. Further, the obtained prepreg was measured for thickness variation in the surface of the first resin layer 10 in the same way as Example 1. The results are shown in Table 1. Further, the obtained prepreg was heated at 180° C. for 60 minutes to thereby cause heat curing. A cross-section of the prepreg after the heat curing was measured using an optical microscope. The thicknesses t1, t2$_U$, tgc, and t2$_L$ of the layers (see FIG. 1) are shown in Table 1.

Further, the same procedure was followed as in Example 1 to prepare a multilayer printed circuit board. Using the prepared multilayer printed circuit board, the same procedure was followed as in Example 1 for evaluation. The results are shown in Table 1.

observing the cross-section of the obtained multilayer printed circuit board, no contact could be observed between the glass cloth and conductor wiring and the result was good. Furthermore, these prepregs which were obtained in the examples all had a thickness t2$_U$ of the B layer of over 0 μm to 2 μm and, further, had a thickness t1 of the first resin layer of 7 μm or less, and a variation in thickness of the first resin layer (before curing) of ±1 μm in range. Further, in these examples, in each case, as the resin composition which forms the first resin layer, one higher in viscosity than the resin composition which forms the second resin layer was used.

On the other hand, when, in accordance with a method similar to the examples, not forming the first resin layer but producing the prepreg somewhat thicker in thickness of the

TABLE 1

|  | Example 1 | Example 2 | Example 3 | Example 4 | Example 5 | Example 6 | Example 7 | Comp. Ex. 1 | Comp. Ex. 2 | Comp. Ex. 3 | Comp. Ex. 4 | Comp. Ex. 5 |
|---|---|---|---|---|---|---|---|---|---|---|---|---|
| Method of production of prepreg*1) | A | B | A | B | C | D | A | E | F | G | H | C |
| Thickness t1 of first resin layer (μm) | 6 | 3 | 2.5 | 6 | 6 | 6 | 5 | 0 | 4 | 3 | 1 | 2 |
| Thickness t2$_u$ of B layer (μm) | 1 | 1.5 | 2 | 2 | 4 | 4 | 4 | 10 | 0 | 0 | 4 | 14 |
| Thickness tgc of fiber base material-containing layer (μm) | 20 | 20 | 10 | 30 | 20 | 20 | 10 | 20 | 20 | 20 | 20 | 20 |
| Thickness t2$_L$ of A layer (μm) | 18 | 20.5 | 25 | 30 | 20 | 25 | 26 | 15 | 21 | 22 | 20 | 14 |
| Total thickness of prepreg (μm) | 45 | 45 | 39.5 | 68 | 50 | 55 | 45 | 45 | 45 | 45 | 45 | 50 |
| Ratio of thickness t2$_L$ of A layer to total thickness (%) | 40 | 46 | 63 | 44 | 40 | 45 | 58 | 33 | 47 | 49 | 44 | 28 |
| Ratio of content of inorganic filler in first resin layer (%) | 24 | 24 | 24 | 24 | 24 | 24 | 24 | — | 24 | 24 | 24 | 24 |
| Ratio of content of inorganic filler in second resin layer (%) | 65 | 65 | 65 | 65 | 65 | 65 | 24 | 65 | 65 | 65 | 65 | 65 |
| Variation in thickness of first resin layer before curing (μm) | Good | Good | Good | Good | Fair | Fair | Good | — | Poor | Poor | Δ | Good |
| Viscosity of first resin layer (Pa · s) | C | C | C | C | C | C | C | — | C | C | C | C |
| Viscosity of second resin layer (Pa · s) | A | A | A | A | A | A | A | A | A | A | A | A |
| Surface roughness of first resin layer*2) | Good | Good | Good | Good | Good | Good | Good | Fair | Good | Good | Fair | Good |
| Variation in surface roughness of first resin layer*3) | Good | Good | Good | Good | Good | Good | Fair | Poor | Poor | Poor | Poor | Fair |
| Unevenness of plating | Good | Good | Good | Good | Good | Good | Good | Poor | Fair | Fair | Poor | Good |
| Contact of glass cloth and conductor wiring | Good | Good | Good | Good | Good | Good | Good | Good | Good | Good | Good | Poor |

*1) In Table 1, the methods of production are as follows.
Method of Production A: Using first resin composition to form first resin layer 10, then superposing fiber base material on first resin layer 10 and impregnating fiber base material with second resin composition.
Method of Production B: Using first resin composition to form first resin layer 10, then coating first resin layer 10 with second resin composition, next, superposing fiber base material and further applying second resin composition on that.
Method of Production C: Using first resin composition to form first resin layer 10, then superposing fiber base material impregnated with second resin composition on first resin layer 10.
Method of Production D: In Method of Production C, further applying and casting second resin composition on fiber base material impregnated with second resin composition.
Method of Production E: Coating second resin composition on support, then superposing fiber base material on that, then applying second resin composition on that.
Method of Production F: Applying first resin composition from one side of fiber base material, then applying second resin composition from opposite side.
Method of Production G: Separately preparing film of first resin composition and film of second resin composition and using these to sandwich fiber base material.
Method of Production H: Coating second resin composition on support, then superposing fiber base material on that, further applying that with a second resin composition, drying it, then applying this with first resin composition.
*2) In Table 1, for Comparative Example 1, the surface roughness of the B layer 21 which forms the second resin layer is shown.
*3) In Table 1, for Comparative Example 1, the variation in the surface roughness of the B layer 21 which forms the second resin layer is shown.

As shown in Table 1, when using a prepreg which is formed with a B layer between the first resin layer and the fiber base material and has a thickness t2$_U$ of B layer which is smaller than the thickness t1 of the first resin layer, it is learned that the obtained multilayer printed circuit board is small in surface roughness of the first resin layer, low in variation of surface roughness, and is formed with a plated conductor layer with no uneven plating on the first resin layer (Examples 1 to 7). Note that, in the prepreg which is obtained in each examples, the thickness t2$_L$ of the A layer is 25% or more of the total thickness of the prepreg. When B layer, it is learned that in the obtained multilayer printed circuit board, the surface roughness at the surface where the plated conductor layer is formed and the extent of variation of the same are inferior (Comparative Example 1).

Further, in a prepreg which is obtained by applying the two sides of glass cloth by the varnish of the first resin composition and the varnish of the second resin composition so as to form the first resin layer and the second resin layer (Comparative Example 2) or in a prepreg which is obtained by forming the first resin layer and the second resin layer on separate supports and sandwiching a glass cloth by the first resin layer and the second resin layer (Comparative Example 3), it is learned that a B layer which is comprised of the second resin composition and which does not contain the fiber base material is not formed between the first resin layer and the fiber base material and that the obtained multilayer printed circuit board becomes larger in variation of the surface roughness of the first resin layer and unevenness of plating. In the prepregs which were obtained in these comparative examples, unlike the prepregs of the present invention, a two-layer structure which is comprised of the first resin layer and the B layer is not formed. It is believed that this is a result of the fact that the effect of relief shapes on the surface of the fiber base material exerted on the surface for forming the plated conductor layer is not sufficiently buffered.

Furthermore, in a prepreg which is obtained by coating the second resin composition on a support, then superposing the fiber base material over this, then further applying this with the second resin composition, drying it, then applying this with the first resin composition (Comparative Example 4), it is learned that the thickness of the first resin layer ends up becoming too much thinner than the thickness of the B layer and that the obtained multilayer printed circuit board becomes larger in variation of the surface roughness of the first resin layer and unevenness of plating. Further, even in the case of producing a prepreg by the same method of production as Example 5, when making the thickness of the first resin layer thinner than the thickness of the B layer (Comparative Example 5), the result is that contact between the glass cloth and the conductor wiring ends up occurring.

REFERENCE SIGNS LIST

10 . . . first resin layer
20 . . . second resin layer
21 . . . B layer
22 . . . fiber base material-containing layer
23 . . . A layer

The invention claimed is:

1. A prepreg provided with a first resin layer and a second resin layer which is formed on the first resin layer, wherein
said first resin layer is formed by a first resin composition,
said second resin layer is a layer which comprises a resin layer which is formed by a second resin composition which is different from said first resin composition and in which a fiber base material is contained,
said second resin layer is provided with a fiber base material-containing layer which contains said fiber base material, an A layer which is positioned at an opposite side of said first resin layer side of said fiber base material-containing layer and which does not contain said fiber base material, and a B layer which is positioned at said first resin layer side of said fiber base material-containing layer and which does not contain said fiber base material,
said B layer has a thickness of over 0 μm to 2 μm, and
said B layer has a thickness which is smaller than the thickness of said first resin layer.

2. The prepreg as set forth in claim 1, wherein a ratio of thickness of said A layer to a thickness of said prepreg as a whole is 25% or more.

3. The prepreg as set forth in claim 1, wherein said first resin layer has a thickness of 7 μm or less.

4. The prepreg as set forth in claim 3, wherein
said first resin layer has a variation in thickness of ±1 μm in range,
said first resin composition and said second resin composition are in an uncured or semicured state, and said first resin composition has a viscosity which is higher than the viscosity of said second resin composition.

5. The prepreg as set forth in claim 1, wherein
said first resin layer is a plateable layer for forming a plated conductor, and said second resin layer is an adhesive layer for adhesion with the substrate.

6. The prepreg as set forth in claim 1, wherein
at least said second resin layer contains an inorganic filler, and a ratio of content of inorganic filler in said second resin layer is 50 to 80 wt % in range and is greater than a ratio of content of inorganic filler in said first resin layer.

7. A laminate comprising the prepreg as set forth in claim 1 and a substrate bonded to a surface of said second resin layer.

* * * * *